United States Patent
Nakamura

(10) Patent No.: US 9,300,909 B2
(45) Date of Patent: Mar. 29, 2016

(54) IMAGE DISPLAY APPARATUS, ELECTRONIC APPARATUS, IMAGE DISPLAY SYSTEM, IMAGE ACQUISITION METHOD AND PROGRAM

(75) Inventor: Kazuo Nakamura, Kanagawa (JP)

(73) Assignee: JOLED Inc., Tokyo (JP)

( * ) Notice: Subject to any disclaimer, the term of this patent is extended or adjusted under 35 U.S.C. 154(b) by 967 days.

(21) Appl. No.: 13/064,976

(22) Filed: Apr. 29, 2011

(65) Prior Publication Data

US 2011/0298953 A1 Dec. 8, 2011

(30) Foreign Application Priority Data

Jun. 7, 2010 (JP) ................................ 2010-130273

(51) Int. Cl.
*G06T 15/00* (2011.01)
*H04N 7/14* (2006.01)
*H04N 5/357* (2011.01)
*H04N 13/04* (2006.01)
*H01L 27/32* (2006.01)
*H01L 51/52* (2006.01)

(52) U.S. Cl.
CPC ............ *H04N 7/144* (2013.01); *H04N 5/3572* (2013.01); *H04N 13/0468* (2013.01); *H01L 27/326* (2013.01); *H01L 27/3234* (2013.01); *H01L 51/5284* (2013.01); *H01L 2251/5315* (2013.01); *H04N 2007/145* (2013.01)

(58) Field of Classification Search
CPC .............. H01L 27/3234; H01L 27/326; H01L 51/5284; H04N 2007/145; H04N 5/3572; H04N 7/144; H04N 13/0468; H04N 2251/5315
See application file for complete search history.

(56) References Cited

U.S. PATENT DOCUMENTS

| 6,590,548 B1 * | 7/2003 | Mizutani et al. ................. 345/32 |
| 2004/0257473 A1 | 12/2004 | Miyagawa et al. |
| 2004/0263670 A1 | 12/2004 | Yamasaki |
| 2005/0128332 A1 | 6/2005 | Tsuboi |
| 2008/0227232 A1 * | 9/2008 | Yamazaki et al. .............. 438/34 |

(Continued)

FOREIGN PATENT DOCUMENTS

| CN | 1574904 A | 2/2005 |
| CN | 101060128 A | 10/2007 |

(Continued)

OTHER PUBLICATIONS

Chinese Office Action issued Jan. 29, 2015 for corresponding Chinese Application No. 201110150709.6.

(Continued)

*Primary Examiner* — Phu K Nguyen
(74) *Attorney, Agent, or Firm* — Michael Best & Friedrich LLP

(57) ABSTRACT

Disclosed herein is an image display apparatus, including: an image display section including a plurality of pixels arrayed therein and each including a display element, the image display section allowing an image pickup section for image pickup to be arranged on the rear face side thereof, the image display section further including a light transmitting part provided in a region thereof corresponding to the image pickup section; and a noise suppression processing unit adapted to carry out, for image information acquired by the image pickup section through the light transmitting part, a reflection noise suppression process for suppressing a reflection component of a display image on the image display section to the picked up image.

20 Claims, 24 Drawing Sheets

(56) References Cited

U.S. PATENT DOCUMENTS

2010/0039538 A1* 2/2010 Ikedo ............................ 348/241
2011/0298953 A1* 12/2011 Nakamura .................... 348/241

FOREIGN PATENT DOCUMENTS

| | | |
|---|---|---|
| CN | 101477291 A | 7/2009 |
| JP | H01-102100 A | 4/1989 |
| JP | 2002-314899 A | 10/2002 |
| JP | 2004-145008 A | 5/2004 |
| JP | 2005-010407 | 1/2005 |
| JP | 2005-176151 | 6/2005 |
| JP | 2009-065498 A | 3/2009 |

OTHER PUBLICATIONS

Chinese Office Action issued Sep. 10, 2015 for corresponding Chinese Application No. 201110150709.6.

* cited by examiner

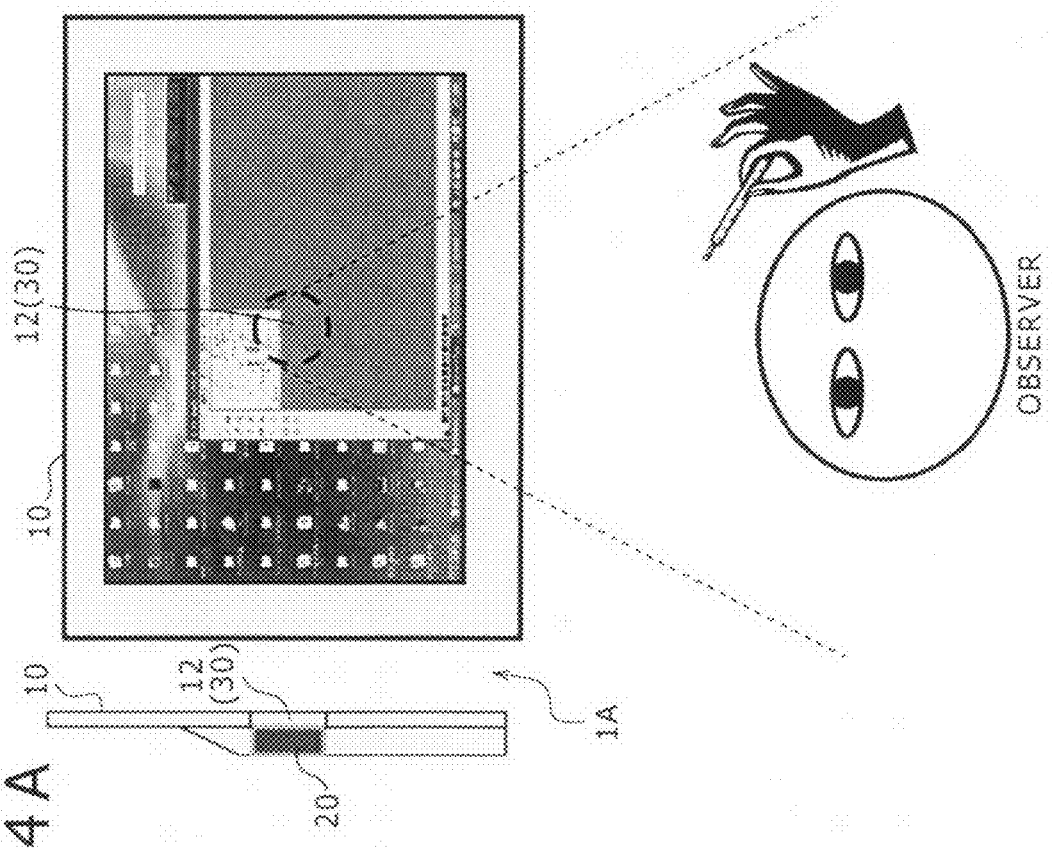
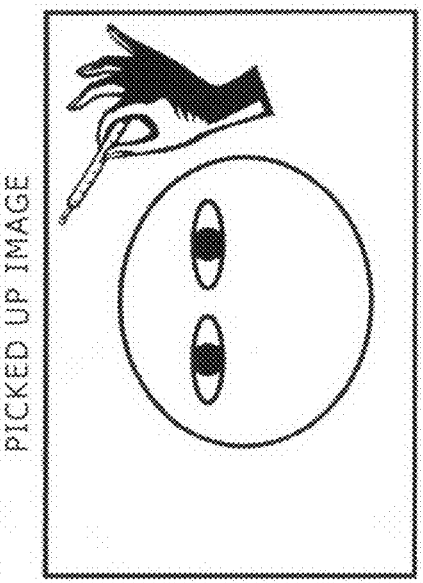
FIG. 4A
FIG. 4B
PICKED UP IMAGE
OBSERVER

FIG. 5A

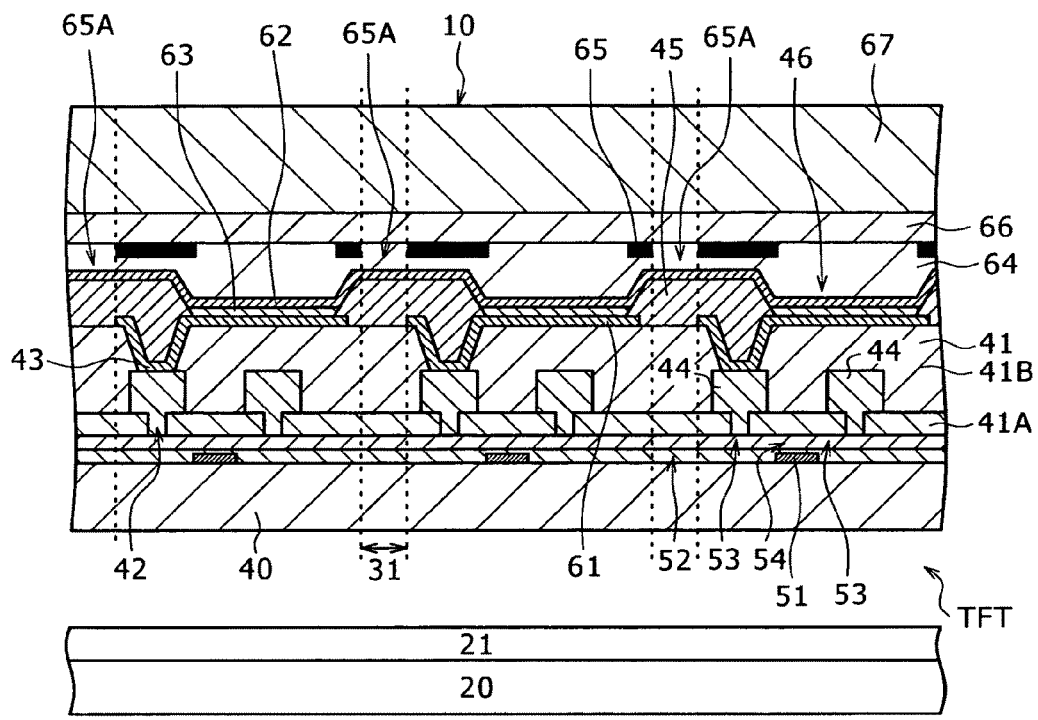

FIG. 5B

| | |
|---|---|
| SECOND SUBSTRATE 67 | : SODA GLASS |
| BONDING LAYER 66 | : ACRYLIC-BASED BONDING AGENT |
| LIGHT BLOCKING LAYER 65 | : BLACK POLYIMIDE RESIN |
| PROTECTIVE LAYER 64 | : SiNx LAYER (THICKNESS : 5 µm) |
| SECOND ELECTRODE 62 (CATHODE ELECTRODE) | : ITO LAYER (THICKNESS : 0.1 µm) OR TRANSLUCENT METAL THIN FILM |
| ELECTRON INJECTION LAYER | : LiF LAYER (THICKNESS : 0.3 nm) |
| ORGANIC LAYER 63 | : LAMINATED STRUCTURE OF HOLE TRANSPORT LAYER AND LIGHT EMITTING LAYER SERVING ALSO AS ELECTRON TRANSPORT LAYER |
| FIRST ELECTRODE 61 (ANODE ELECTRODE) | : Al-Nd LAYER (THICKNESS : 0.2 µm) |
| INTERLAYER INSULATING LAYER 41 | : SiO₂ LAYER |
| TFT | : CONFIGURE DRIVING CIRCUIT |
| FIRST SUBSTRATE 40 | : SODA GLASS |

IMAGE PICKUP WITHOUT PASS THROUGH LIGHT TRANSMISSION PART

IMAGE PICKUP THROUGH LIGHT TRANSMISSION PART

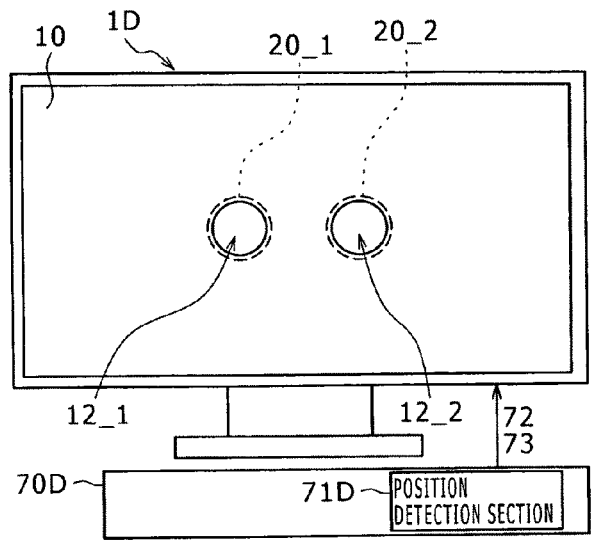
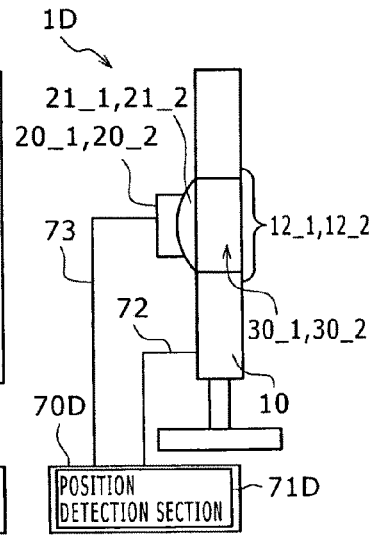
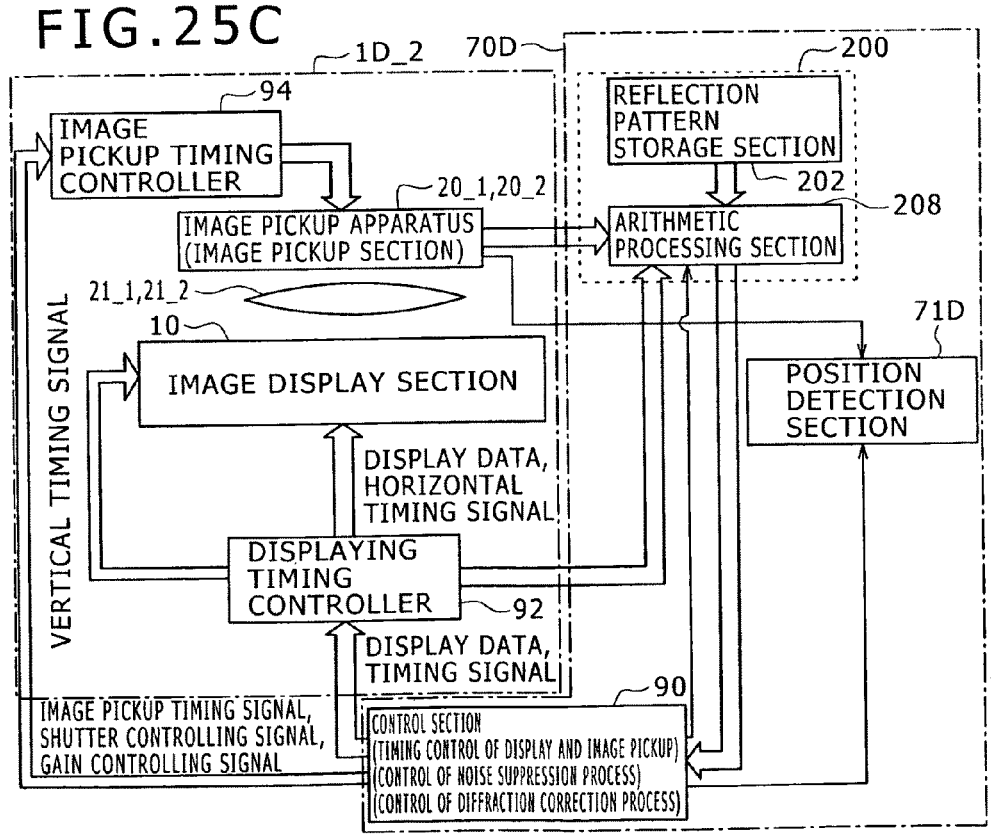

IMAGE DISPLAY APPARATUS, ELECTRONIC APPARATUS, IMAGE DISPLAY SYSTEM, IMAGE ACQUISITION METHOD AND PROGRAM

BACKGROUND

The present disclosure relates to an image display apparatus, an electronic apparatus, an image display system, an image acquisition method and a program. More particularly, the present disclosure relates to a mechanism for picking up an image of an image pickup object on a display face side of an image display section with an image pickup apparatus disposed on the rear face side.

An attempt to combine an image display apparatus and an image pickup apparatus to additionally provide the image display apparatus with a function other than an image displaying function has been and is being conducted energetically. An apparatus of the type described is disclosed, for example, in Japanese Patent Laid-Open No. 2005-176151 (hereinafter referred to as Patent Document 1) or Japanese Patent Laid-Open No. 2005-010407 (hereinafter referred to as Patent Document 2).

According to the technique disclosed in Patent Document 1, a plurality of light transmitting portions each in the form of an opening and each having a very small lens are provided between pixels which configure an image display section of an image display apparatus. Then, light transmitted through the light transmitting portions is picked up as an image by a plurality of cameras. In this instance, an image of the face of a user who watches the image display apparatus is picked up from a plurality of different angles, and a resulting plurality of images are processed to generate an image which captures the user from the front.

According to the technique disclosed in Patent Document 2, an image pickup apparatus picks up an image based on light having transmitted through one light transmitting part provided for a plurality of pixels as shown, for example, in FIGS. 15 and 16 of the document.

SUMMARY

However, it has been found that, if an image is picked up on the rear face side of an image display section through the image display section, then unique noise which does not appear when an image is picked out without transmission of light through the image display section appears.

Further, in the technique disclosed in Patent Document 1, in the case where the light transmitting portions are very small, a diffraction phenomenon occurs at the light transmitting portions. The diffraction phenomenon gives rise to appearance of blurring on an image formed by the image pickup apparatus, and the picked up image sometimes lacks in sharpness by an influence of the blurring.

Further, in the technique disclosed in Patent Document 1, a very small lens is provided for each opening and besides a highly accurate very small lens is used in order to form an image accurately on the image pickup apparatus. Therefore, the image display apparatus is fabricated at a high production cost. Besides, not an image of the face of the user from the front is picked up, but an image from the front is produced from a plurality of images picked up from different angles. Consequently, this image pickup is not actual image pickup, but a CG (Computer Graphics) image is provided to the other end, and therefore, the image provides an uncomfortable feeling.

Also in the technique disclosed in Patent Document 2, in the case where the light transmitting part is very small, a diffraction phenomenon occurs at the light transmitting part similarly as in the technique disclosed in Patent Document 1. Consequently, blurring occurs on an image formed by the image pickup apparatus, and the picked up image sometimes lacks in sharpness by an influence of the blurring. In addition, since an image is picked up on the image pickup apparatus based on light transmitted through one light transmitting part provided for a plurality of pixels, it is difficult to condense a sufficient amount of light on the image pickup apparatus.

Therefore, it is desirable to provide an image display apparatus, an electronic apparatus, an image display system, an image acquisition method and a program which can suppress unique noise which appears on a picked up image in the case where the image is picked up through an image display section on the rear face side of the image display section.

Further, it is desirable to provide an image display apparatus, an electronic apparatus, an image display system, an image acquisition method and a program which can suppress an influence, on an image, of a diffraction phenomenon which appears at very small light transmitting portions of a display section when an image of an image pickup object on the display face side is picked up by an image pickup apparatus disposed on the rear face through the light transmitting portion.

Furthermore, it is desirable to provide an image display apparatus, an electronic apparatus, an image display system, an image acquisition method and a program which can be produced at a low cost and can readily capture an image of a user facing the front of an image display section.

Also it is desirable to provide an image display apparatus, an electronic apparatus, an image display system, an image acquisition method and a program wherein a sufficient amount of light can be condensed on an image pickup apparatus.

According to a first embodiment of the present disclosure, there is provided an image display apparatus including an image display section including a plurality of pixels arrayed therein and each including a display element, the image display section allowing an image pickup section or image pickup apparatus for image pickup to be arranged on the rear face side thereof, the image display section further including a light transmitting part provided in a region thereof corresponding to the image pickup section or image pickup apparatus, and a noise suppression processing unit adapted to carry out, for image information acquired by the image pickup section or image pickup apparatus through the light transmitting part, a reflection noise suppression process for suppressing a reflection component of a display image on the image display section to the picked up image. In short, a reflection component which corresponds to the display image and is included in the picked up image is suppressed from an aspect of signal processing.

Preferably, timings of display and image pickup are synchronized with each other. In particular, the image display apparatus further includes a timing control section adapted to establish synchronism between a display timing by the image display section and an image pickup timing by the image pickup section or image pickup apparatus. It is to be noted that, when establishing the synchronism, a reflection component which corresponds to the display image and is included in the picked up image may be suppressed preferably in cooperation with the countermeasure from an aspect of signal processing.

Preferably, the noise suppression processing unit uses only some of signal components which configure an image as a processing target so that speedup of signal processing is achieved in comparison with that in an alternative case in which all signal components are used as the processing target.

While various methods are applicable to determination of such "some of signal components," for example, it may be recommendable to adopt a method wherein, for example, only image information in a particular region extracted from image information acquired by the image pickup section or image pickup apparatus is used as the target. This reduces the processing target area and can thereby achieve speedup of the processing. In this instance, preferably a particular object determined in advance such as a person, the face of a person, a particular region of the face of a person or the like is used as the particular region so that speedup of the processing may be achieved without deteriorating the sensory noise suppression effect.

In particular, preferably the noise suppression processing unit carries out the reflection noise suppression process for image information in a particular region extracted from the image information acquired by the image pickup section or image pickup apparatus through the light transmitting part and synthesizes image information for which the reflection noise suppression process of a background region other than the particular region has not been carried out and the image information for which the reflection noise suppression process has been carried out in regard to the particular region.

The noise suppression processing unit may carry out the reflection noise suppression process for at least one of a plurality of signals which represent the image information acquired by the image pickup section or image pickup apparatus, the reflection noise suppression process being not carried out for all of the plural signals. In this instance, preferably only a signal component having a high correlation with luminance information, typically a green light component, or only luminance information is processed so that speedup of the processing is achieved while preventing reduction of the noise suppression effect.

The method wherein only image information in a particular region is used as the processing target and the method wherein at least one but not all of a plurality of signals representative of image information acquired by the image pickup section or image pickup apparatus is used as the processing target may be used in combination.

According to a second embodiment of the present disclosure, there is provided an image display apparatus including an image display section including a plurality of pixels arrayed therein and each including a display element, the image display section allowing an image pickup section or image pickup apparatus for image pickup to be arranged on the rear face side thereof, the image display section further including a light transmitting part provided in a region thereof corresponding to the image pickup section or image pickup apparatus, and a timing control section adapted to control a display timing by the image display section and an image pickup timing by the image pickup section or image pickup apparatus so that a reflection component, to a picked up image, of a displayed image by the image display section which may possibly be included in image information acquired by the image pickup section or image pickup apparatus through the light transmitting part may be suppressed.

Preferably, timings of display and image pickup are synchronized with each other. In particular, the timing control section establishes synchronism between the display timing by the image display section and the image pickup timing by the image pickup section or image pickup apparatus. It is to be noted that, when establishing the synchronism, a reflection component corresponding to the display image which is included in the picked up image is suppressed preferably in cooperation with the countermeasure from an aspect of signal processing.

Preferably, the light transmitting part includes a plurality of such light transmitting portions provided in a region of the image display section corresponding to the image pickup section or image pickup apparatus, the image display apparatus further including a diffraction correction unit adapted to carry out a diffraction correction process for suppressing an influence of a diffraction effect by the light transmitting part to be had on the image information acquired by the image pickup section or image pickup apparatus through the plural light transmitting portions.

Preferably, the image display apparatus further includes a wavelength distribution measuring section adapted to measure a wavelength distribution of external light, the diffraction correction unit referring to the wavelength distribution of external light measured by the wavelength distribution measuring section to carry out the diffraction correction process.

Preferably, the image display apparatus further includes a condensing section adapted to condense light transmitted through the light transmitting part on the image pickup section or image pickup apparatus, thereby light transmitted through the light transmitting part is condensed on the image pickup section or image pickup apparatus with certainty.

With the image display apparatus according to the first and second embodiments, the image pickup section, or image pickup apparatus is arranged on the rear face side of the image display section such that an image of an image pickup object on the display face side is picked up through the light transmitting part. Therefore, an image of a user who faces the image display apparatus can be acquired readily.

Thereupon, a reflection component which may possibly appear on a picked up image when image information is acquired through the light transmitting part by the image pickup section or image pickup apparatus can be suppressed by the first method wherein the reflection noise is suppressed from an aspect of signal processing or the second method wherein the timings of display and image pickup are controlled.

Further, an influence of a diffraction phenomenon, which appears with the light transmitting part, on the image can be suppressed by a countermeasure from an aspect of signal processing. At this time, if the information not in the overall region but only in a particular region of the image is determined as the processing target, then the processing time can be reduced in comparison with an alternative case in which all signal components are used as the processing target.

Further, if only some of a plurality of signal components which configure an image is used as a target of the diffraction correction process, then the processing time can be reduced in comparison with that in the alternative case in which all signal components are used as the processing target. In this instance, if a luminance signal component or only a signal component having a high correlation with the luminance, for example, a green light component, is used as the target of diffraction correction process, then the processing time can be reduced. In addition, the correction process can be carried out with accuracy not inferior but similar to that in the case in which all signal components are used as the processing target.

Further, if also a countermeasure from an aspect of the light transmitting part itself arranged in the light transmitting region is taken, then appearance of a diffraction phenomenon at the light transmitting part can be suppressed in advance. As a result, an influence of a diffraction phenomenon on the image can be suppressed with a higher degree of certainty.

Further, if the light condensing section is arranged between the image display section and the image pickup section or image pickup apparatus, then since light transmitted through the light transmitting part is condensed with certainty on the image pickup section or image pickup apparatus, a sufficient amount of light can be condensed on the image pickup section or image pickup apparatus. The image display apparatus can be produced at a low cost without requiring a very small lens of high accuracy in order to form an image accurately on the image pickup plane of the image pickup section or image pickup apparatus and without inviting of an increase of the production cost of the image pickup section or image pickup apparatus.

The above and other features and advantages of the present disclosure will become apparent from the following description and the appended claims, taken in conjunction with the accompanying drawings in which like parts or elements denoted by like reference symbols.

BRIEF DESCRIPTION OF THE DRAWINGS

FIGS. 4A and 4B are schematic views illustrating image pickup by the image display apparatus;

FIGS. 5A and 5B are views illustrating details of the image display section;

FIGS. 25A to 25C are views showing a second modification to the image display system.

DETAILED DESCRIPTION OF THE PREFERRED EMBODIMENTS

Figure 1A:
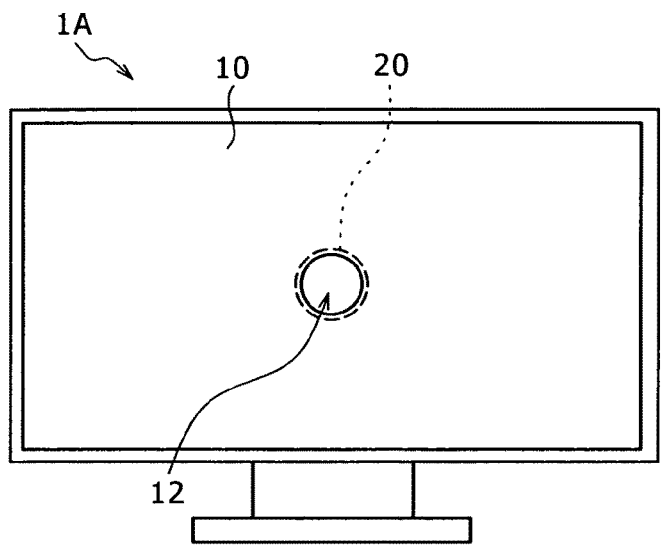
FIGS. 1A through 1D are schematic views showing an image display apparatus and an image display system according to a first embodiment, respectively.

In the following, embodiments of the present disclosure are described in detail with reference to the accompanying drawings. In the present specification, in order to distinguish each functioning element among different embodiments, a reference symbol of an alphabetical capital letter such as A, B, . . . is added to the reference numeral for the functioning element, and in the case where there is no necessity for such distinction, the reference symbol is omitted. This similarly applies also to the accompanying drawings. Various numerical values and materials described in the embodiments are only illustrative and there is no intention to apply restriction to them.

Description is given in the following order:

1. Basic Concept (outline, reflection noise suppression process, diffraction correction process, wavelength distribution measurement, light transmitting region, image pickup apparatus, image display section)

2. First Embodiment (general configuration, arrangement position of image pickup apparatus, sectional structure of image display section, configuration ready for reflection noise suppression, synchronization control of countermeasure against reflection phenomenon)

3. Reflection noise suppression process (first example: processing area reduction method)

4. Reflection noise suppression process (second example: first example+all signals)

5. Reflection noise suppression process (third example: first example+particular signal→signal having correlation with luminance information)

6. Reflection noise suppression process (fourth example: first example+luminance information, summary of first to fourth examples)

7. Second Embodiment (first embodiment+configuration ready for diffraction correction, countermeasure principle against diffraction phenomenon)

8. Third Embodiment (second embodiment+wavelength distribution measurement process)

9. Alternative of a Monitor Apparatus of an Electronic Equipment

10. Summary (first modification: position detection, second modification: three-dimensional image display+position detection, third modification: TV conference system, fourth modification: digital mirror)<

<Basic Concept>

Outline

In an image display apparatus with an image pickup apparatus (hereinafter referred to simply as "image display apparatus") according to any one of the embodiments hereinafter described, an image pickup apparatus (or an image pickup section: this similarly applies also in the following description) is disposed on the rear face of an image display section. Further, a light transmitting part is provided in a light transmitting region of the image display section which corresponds to the image pickup apparatus. Thus, an image of an image pickup object on the display face side is picked up through the light transmitting part, that is, through the image display section.

Light transmitted through the light transmitting part is condensed on the image pickup apparatus. Since the image pickup apparatus is arranged on the rear face side of the image display section, an image of the face, eyes, a movement and so forth of a user who faces the image display apparatus can be picked up accurately by the image pickup apparatus. Such a light transmitting part, through which light reaches the rear face, is provided on the image display section, that is, a display panel of the display apparatus, and the image pickup apparatus is arranged at a corresponding position to the light transmitting part. Therefore, by picking up an image of the face, eyes, a movement and so forth of the user who faces the image display apparatus can be picked up by the image pickup apparatus, they can be captured accurately. Consequently, the display apparatus has an added value raised simply, readily and at a low cost.

Though not essential, if a light condensing section is arranged between the image display section and the image pickup apparatus, then light transmitted through the light transmitting part is condensed with certainty on the image pickup apparatus. By the arrangement of the light condensing section, a very small lens of a high degree of accuracy is not required in order to form an image accurately on the image pickup apparatus. Consequently, increase of the production cost of the image display apparatus is not invited, and a sufficient amount of light can be condensed on the image pickup apparatus.

Reflection Noise Suppression Process

In the image display apparatus of any of the embodiments, it has been found that, if image pickup is carried out on the rear face side of the image display section through the image display section, then unique noise which does not appear when image pickup is carried out without through the image display section appears on a picked up image. An investigation for the cause of appearance of such noise was conducted, and it was found that the noise is generated such that light from display elements of the image display section, that is, display light, is reflected by various portions in the inside of the image display section and enters as stray light into the image pickup apparatus.

In the following description, unique noise which cannot exist when image pickup is carried out without through the image display section but appears on an image picked up on the rear face side of the image display section through the image display section is referred to as "reflection noise."

As a countermeasure against this reflection noise, in the embodiments, a timing control section configured to control a display timing of the image display section and an image pickup timing of the image pickup apparatus is provided. The timing control section controls the timings so that a reflection component of a display image of the image display section which can be included in image information acquired by the image pickup apparatus through the light transmitting portion can be suppressed.

The timing control section displaces the display timing and the image pickup timing by a great amount from each other, or in other words, carries out image pickup and display asynchronously at frame rates different by a great amount from each other to make reflection noise less recognizable by appearances. The method just described is hereinafter referred to as reflection noise suppression method by a visual effect. In the case where image pickup and display are asynchronous, if the frame rates are proximate to each other, then reflection of a display image of the picked up image is recognized as a flicker phenomenon. Such a phenomenon is recognized, for example, at a frame rate difference lower than 30 frames. In contrast, if the difference between the frame rates is set greater than 30 frames, then even if reflection of a display image on a picked up image occurs, this is less likely to be recognized visually.

However, if there is no degree of freedom in setting of the frame rates, the reflection noise suppression method by a visual effect cannot be adopted. Therefore, in the embodiments, as another mode, an influence of reflection noise on a picked up image is corrected from an aspect of signal processing to achieve high quality of an image. This method is hereinafter referred to as reflection noise reduction method by signal processing.

In the reflection noise suppression method by signal processing, a reflection noise suppression processing unit first refers to video data of the image display section to suppress, preferably to fully remove, reflection noise in an image picked up by the image pickup apparatus thereby to acquire an image of high quality. In other words, even in the case where a display image is reflected during an image pickup period, such reflection components, which are reflection noise, are decided from the video data and are suppressed or removed from the picked up image. Image pickup of reflection components caused by incidence of light from a display element as stray light to the image pickup apparatus makes a cause of the reflection noise. Therefore, the amount of the reflection noise has a correlation to the video data which serves as a source of the reflection noise or stray light. Consequently, the reflection components can be removed by subtracting the correction amount calculated based on the video data from the picked up image data.

When the reflection noise suppression process is applied to image information, a method of processing individual components which configure the image information such as, for example, color image information of R, G and B may be used. Or, a method of decreasing the noise suppression processing time by processing some of such signal components to achieve reduction of the noise suppression processing time may be used.

In the former method, since the noise suppression process is applied to all signal components which configure the image information, although the processing load is high, the noise suppression effect is higher than the latter method. On the other hand, since the latter method applies the noise suppression process to some of the signal components which configure the image information, although the noise reduction effect is lower than the former method, the processing load is reduced.

In the case of the latter method, it seems available to adopt, as a first method, a method of processing not a signal component in the entire region of a picked up image acquired by the image pickup apparatus but a signal component in part of the region (such method is hereinafter referred to as "processing area reduction method") to achieve reduction of the noise suppression processing time. In short, the method applies the noise suppression process to part of the signal component from an aspect of the processing area.

Also it seems available to adopt a method of processing not all signal components but at least one signal component representing the signal components (such method is hereinafter referred to as "particular signal-oriented method") to achieve reduction of the noise suppression processing time. In short, the method applies the noise reduction process to some signal component from an aspect of the number of processing target signals.

In the processing area reduction method, part of the region of an image which is made a target of the noise suppression process is referred to as "particular region," and the remaining region in the case where the "particular region" is removed is referred to as "background region." A picked up image is separated into a "particular region" and a "background region," and the noise suppression process is applied only to the "particular region." Therefore, signal components of an image in the "particular region" after the noise suppression and signal components of an image in the "background region" for which the noise suppression process is not applied are combined with each other to complete the processing.

The "particular region" separated or extracted from the overall region of a picked up image has a small area in comparison with the area of the overall picked up image. Therefore, the calculation amount is reduced in comparison with that in the alternative case wherein processing is carried out for the overall region of the picked up image, and the noise suppression processing time is reduced. Consequently, the processing can be carried out at an increased speed.

The "particular region" can be set by various methods or from various points of view. Roughly speaking, two method are available. According to one of the methods, a particular region is defined from an aspect of a place such as a central portion or a corner portion of a picked up image. The method is hereinafter referred to as "place-oriented method." According to another one of the methods, a particular region is defined from an aspect of a particular or noticeable target determined in advance like a user. The method is hereinafter referred to as "image pickup object-oriented method." With the latter method, since the noise suppression process is carried out, for example, only for an image of a person, high speed processing can be achieved in comparison with the alternative case wherein the noise suppression process is carried out for the overall screen image.

In the place-oriented method, a place to be extracted from image information acquired by an image pickup apparatus is determined in advance. Or, several candidate places may be presented so that the user can select one of them. The place-oriented method may further define a shape such as a rectangle or a circle when a "particular region" is to be extracted from a picked up image. Also the shape upon extraction may be determined in advance, or several candidate shapes may be presented so that the user can select one of them.

The image pickup object-oriented method may further adopt a method of defining a particular region from an aspect of a region of part of the image pickup object. The method is hereinafter referred to as "particular region-oriented method." When it is tried to remove noise components from an image which includes reflection noise to make an image of a person sharper, if the image is processed such that, even if the image is not sharp with regard to the entire person, if only the entire face or a particular region representative of a characteristic of the face such as the eyes, nose or mouth is represented as a sharp image free from reflection noise, then the image does not provide an uncomfortable feeling. By the processing, the area ratio of the image which is made a processing target is reduced further, and consequently, the processing can be carried out at a further high speed. Further, although the noise suppression effect is inferior substantively, the sensory noise suppression effect is not deteriorated.

In the image pickup object-oriented method including the particular region-oriented method, when a specified image pickup object region is to be extracted from an overall image, it is possible to adopt a method of extracting the image pickup object region in fidelity along a contour thereof. However, if the facility is taken into consideration, then it is preferable to use a shape determined in advance such as, for example, a rectangular shape as the shape of the region when the region of the image pickup object or part of the image pickup object is to be extracted.

The image pickup object-oriented method including the particular region-oriented method is forced to include a process of extracting or specifying an image pickup object or a particular region from an overall image, and generally the processing load is heavy. In contrast, the place-oriented method is simple in the extraction process since the "particular region" to be extracted from an overall image can be set to a shape determined in advance.

In the case where the image pickup object-oriented method including the particular region-oriented technique is adopted, the "particular region" may be caused to follow up the movement of the image pickup object including the particular region.

Also it seems possible to combine the place-oriented method and the image pickup object-oriented method including the particular region-oriented method. For example, it seems possible to first adopt the place-oriented method to determine, for example, a central portion of a picked up image but intermediately change over the used method to the image pickup object-oriented method or particular region-oriented method so that the "particular region" follows up the movement of the image pickup object including the particular region. Also in the case where an image pickup object sticks out from a central portion of the screen, a noise suppression process which attaches importance to the image pickup object to be noticed including the particular region can be executed with certainty.

In the "particular signal-oriented method," signal components after noise suppression and the remaining signal components for which the noise suppression process has not been carried out are combined with each other thereby to complete the processing. Since the number of signal components which are determined as a target of the noise suppression process is small than the number of all signal components which represent the image, the calculation amount is reduced in comparison with that in the alternative case wherein all signal components are determined as a target of the noise suppression process. Consequently, the noise suppression processing time is reduced, and accordingly, the processing can be carried out at a higher speed.

In the case of the particular signal-oriented method, it seems possible to use a process wherein attention is paid, for example, to one of different colors such as, for example, R (red), G (green) and B (blue). Also in this instance, it is preferable to pay attention to a luminance signal component or color image information having a relatively high correlation with a luminance signal component. Speedup of a noise suppression process can be anticipated while the substantial or apparent noise suppression effect is maintained at a level substantially equal to that where all signals are determined as a target.

For example, it is generally known that, as a characteristic of the visual sense of the human being, the visual sense has a high sensitivity particularly to the luminance or contrasting and the luminance component has a high correlation with the green component of an image. Thus, it seems possible to use a noise suppression process which utilizes such sensitivity of the human being to the luminance. In particular, the noise suppression process is carried out only for the luminance component of a picked up image.

It was confirmed that, according to a method which pays attention to such a characteristic of the visual sense of the human being as described above, an image for which the noise suppression process has been carried out exhibits a suppression effect which is not inferior from a point of view of reflection noise when compared with an image with regard to which the noise suppression process is carried out for all signal components which configure image information. Further, the processing time can be reduced in comparison with the alternative case in which the noise suppression process is carried out for all signal components. In short, speedup of the noise suppression process can be implemented.

In the embodiments, it is made possible for the user to select a desired one of the various methods of the noise suppression process from a point of view of the processing speed, noise suppression accuracy or the like.

When reflection noise is suppressed from a picked up image by referring to video data, a correction amount calculated, for example, based on the video data is subtracted from the picked up image data. However, in the case where display and image pickup timings are not in synchronism with each other, processing or control for the subtraction is complicated although this is not impossible. For example, it is considered that it is forced to use a function for carrying out not only delivery of video data or picked up image data but also delivery of timing information for display or image pickup or a function for controlling such display or image pickup.

Therefore, in the embodiments, the image display apparatus and the image pickup apparatus cooperatively deal so that an influence of reflection noise on a picked up image can be corrected from an aspect of signal processing. To "cooperatively deal" signifies to control the display timing of the image display apparatus and the image pickup timing of the image pickup apparatus so that reflection components of a display image of the image display section, which can be included in image information acquired by the image pickup apparatus through the light transmitting part, can be suppressed. Preferably, the display timing of the image display apparatus and the image pickup timing of the image pickup apparatus are synchronized with each other. When the synchronism is to be established, it may be determined arbitrarily which one of the image display apparatus and the image pickup apparatus serves as a master while the other serves as a slave. Substantially, it is better to start image pickup of the image pickup apparatus in conformity with the display timing of the image display apparatus.

By establishing the synchronism between the timings, removal of display image components on picked up image data can be carried out readily, and a picked up image of high quality can be acquired. For example, image pickup of the image pickup apparatus is started normally, that is, for each frame, at a particular timing within a display period of the image display apparatus, that is, at the same timing for each frame. By starting image pickup of the image pickup apparatus in this manner, even in the case where a reflection component having a correlation to a display image or video data exists in an image acquired by the image pickup apparatus, the component can be suppressed or removed readily. For example, by starting image pickup at a particular timing within a display period of the display apparatus, reflection of the display image upon the picked up screen image can be removed effectively, and a picked up image of high quality can be acquired.

The reflection noise suppression processing unit may be provided in the image display apparatus or in the image pickup apparatus or an apparatus on a succeeding stage which utilizes an image acquired by the image pickup apparatus. In the case where the reflection noise suppression processing unit is provided in the image display apparatus, a picked up image acquired by the image pickup apparatus may be passed to the image display apparatus. The image display apparatus may estimate the amount of reflection noise, which may possibly be included in picked up image data and has a correlation with video data, in accordance with the display timing and remove reflection components. In the case where the reflection noise suppression processing unit is provided in the image pickup apparatus or in an apparatus on a succeeding stage to the image pickup apparatus, information of a display image, that is, video data, may be passed to the image pickup apparatus or the succeeding stage apparatus. The image pickup apparatus or the succeeding stage apparatus may estimate the amount of reflection noise, which may possibly be included in the picked up image data and has a correlation with the video data, in accordance with the image pickup timing and remove reflection components.

For example, the reflection noise suppression processing unit may be provided as a circuit having inputting and outputting sections and configured from a CPU (central processing unit) and a memory in an image display apparatus or an electronic apparatus which incorporates the image display apparatus. Or, in the case where the image display apparatus and the image pickup apparatus are configured separately or removably from each other, the reflection noise suppression processing unit may be provided in the image pickup apparatus, which is an example of an electronic apparatus, disposed on the rear face of the image display apparatus. On the other hand, in an image display system wherein a peripheral apparatus such as a personal computer or an electronic computer is connected to the image display apparatus, the function of the reflection noise suppression processing unit may be provided in the peripheral apparatus.

Diffraction Correction Process

In the image display apparatus of the embodiments, the image pickup apparatus is disposed on the rear face of the image display section, and an image of an image pickup object on the display face side is picked up through a light transmitting part, that is, the image display section. In the case where an opening of the light transmitting part which configures the light transmitting region is small, if an image is picked up through the opening, then a diffraction phenomenon occurs. As a result, an image formed on the image pickup apparatus sometimes suffers from blurring or lacks in sharpness.

As a countermeasure against this, in the embodiments, the image display apparatus and the image display system may include a diffraction correction unit in order to eliminate an influence of a diffraction phenomenon which occurs at the light transmitting part from an aspect of signal processing. Preferably, an aspect of the light transmitting part itself such as the shape, size, distribution or the like may be utilized to suppress appearance of a diffraction phenomenon.

The diffraction correction unit carries out correction against diffraction, which occurs at the light transmitting part which configures the light transmitting region, for picked up image information and other image data acquired through the image pickup apparatus. Incidentally, the "other image data" is, for example, image data obtained by image pickup of the user or the like using the image pickup apparatus and used to be displayed on the image display section. In the following description, the picked up image information and the "other image data" may be collectively referred to merely as "image data."

For example, some or all of openings of the light transmitting part are provided cyclically along a first direction and a second direction of the image display section. At this time, in the case where the length of each light transmitting portion of the light transmitting part along the first direction is represented by $L_{tr-1}$ and the pitch of the pixels along the first direction is represented by $P_{px-1}$, the line aperture ratio $L_{tr-1}/P_{px-1}$ in the first direction is preferably set so as to satisfy $L_{tr-1}/P_{px-1} \geq 0.5$, and more preferably set so as to satisfy $L_{tr-1}/P_{px-1} \geq 0.8$. The line aperture ratio $L_{tr-1}/P_{px-1}$ is not restricted specifically as far as the light transmitting part can be formed. Here, the length $L_{tr-1}$ of the light transmitting portion along the first direction signifies the length per one cycle of a line segment corresponding to the shape of the light transmitting portion when the light transmitting portion is projected in the first direction. Meanwhile, the pitch $P_{px-1}$ of the pixels along the first direction signifies the length per one cycle of the pixels along the first direction.

Meanwhile, in the case where the length of the light transmitting portion along the second direction is represented by $L_{tr-2}$ and the pitch of the pixels along the second direction is represented by $P_{px-2}$, the line aperture ratio $L_{tr-2}/P_{px-2}$ in the second direction is preferably set so as to satisfy $L_{tr-2}/P_{px-2} \geq 0.5$, and more preferably set so as to satisfy $L_{tr-2}/P_{px-2} \geq 0.8$. The line aperture ratio $L_{tr-2}/P_{px-2}$ is not restricted specifically as far as the light transmitting portion can be formed. Here, the length $L_{tr-2}$ of the light transmitting portion along the second direction signifies the length per one cycle of a line segment corresponding to the shape of the light transmitting portion when the light transmitting portion is projected in the second direction. Meanwhile, the pitch $P_{px-2}$ of the pixels along the second direction signifies the length per one cycle of the pixels along the second direction.

The first and second directions may be perpendicular to each other or may intersect at an angle other than 90 degrees with each other as occasion demands. In the latter case, some or all of the light transmitting portions are sometimes provided cyclically not only in the first and second directions of the image display section but also in a third direction, a fourth direction, . . . . In such a case as just described, the length of the light transmitting portion at least along two directions from among the directions and the pitch of the pixels along the at least two directions preferably satisfy the relationship described hereinabove, particularly the relationship that the ratio is equal to or higher than 0.5 times, more preferably equal to or higher than 0.8 times.

The diffraction correction process by the diffraction correction unit may be a process which uses a response function, which represents a spatial frequency characteristic, for evaluating a sharpness or resolution of an image picked up by the image pickup apparatus and uses a modulation transfer function (MTF) representative of the amplitude in absolute value of the response function as an index value. As publicly known, a response function is determined by Fourier transforming a point image or line image intensity distribution. An influence of resolution drop, that is, of a degree of blurring of an image, which appears with an image upon image pickup through the light transmitting part by the image pickup apparatus, corresponds to an arrangement pattern of the light transmitting portions, that is, very small openings. For example, the influence of resolution drop, that is, the degree of blurring of an image, can be evaluated from the magnitude of high frequency components of the MTF.

Accordingly, if the arrangement pattern of the light transmitting portions is referred to to apply inverse Fourier transform to a picked up image, then an image from which an influence of resolution drop which appears with an image by image pickup through the light transmitting portions by the image pickup apparatus is eliminated can be restored. In other words, the diffraction correction process may be carried out by Fourier transforming image information acquired by the image pickup apparatus and then inverse Fourier transforming the information obtained by the Fourier transform using a response function, here an MTF, which corresponds to the arrangement state of the light transmitting portions.

Preferably, for example, an MTF inverse transform process, that is, an image restoration process, calculated based on the arrangement pattern such as the shape, size, distribution or the like of the light transmitting portions is applied to image information. In the MTF inverse transform process, MTF shape data is used to carry out the MTF inverse transform process for signal components of a picked up image. In this instance, a storage section may be provided in the diffraction correction unit such that MTF shape data representative of the shape, size, distribution and so forth of the light transmitting portions are stored in advance in the storage section. The response function may be specified applying a Fourier transform method for Fourier analyzing a signal representative of an image.

The method of the diffraction correction process described above is a mere example of a method of correcting an influence of resolution drop, that is, a degree of blurring of an image, which appears with an image upon image pickup through the light transmitting part by the image pickup apparatus. Thus, any other known method may be applied.

The diffraction correction unit may be provided as a circuit having inputting and outputting sections and configured, for example, from a CPU and a memory in the image display apparatus or the electronic apparatus which incorporates the image display apparatus. Or, in the case where the image display apparatus and the image pickup apparatus are configured separately or removably from each other, the diffraction correction unit may be provided in the image pickup apparatus, which is an example of an electronic apparatus, disposed on the rear face of the image display apparatus. On the other hand, in an image display system wherein a peripheral apparatus such as a personal computer or an electronic computer is connected to the image display apparatus, the function of the diffraction correction unit may be provided in the peripheral apparatus.

When the MTF inverse transform process is applied to image information, a method of carrying out the process for each of signal components such as, for example, color image information of R, G and B which configures the image information or another method of carrying out the process for some of such signal components to achieve reduction of the correction processing time may be applicable. This is based on a similar concept to that applied in the reflection noise suppression process described hereinabove. Various noise suppression processing methods may be prepared such that the user can select one of the methods desirable from a point of view of the processing speed, noise suppression accuracy or the like.

It is to be noted that which one of the reflection noise suppression process and the diffraction correction process is to be executed first may be determined basically arbitrarily. For example, in the case where the reflection noise suppression process is executed first and then the diffraction correction process is executed, there is no special disadvantage. On the other hand, in the case where the diffraction correction process is executed first and then the reflection noise suppression process is executed, the reflection image does not include a diffraction component. Therefore, if the diffraction correction is carried out first for an original image which suffers from diffraction+reflection, then since the diffraction process is carried out for the diffraction-free+reflection components, a defect appears. Accordingly, according to a comprehensive decision, it is better to execute the reflection noise suppression process first and then execute the diffraction correction process.

Wavelength Distribution Measurement

The image display apparatus and the image display system of the embodiments can be configured such that they further include a wavelength distribution measuring section configured to measure a wavelength distribution of external light. By adopting such a configuration as just described, in the diffraction correction process, not only the shape, size and distribution of the light transmitting portions but also the wavelength distribution of external light can be taken into consideration. Consequently, enhancement in accuracy of the MTF inverse transform process can be anticipated, and an optimum image can be obtained irrespective of the external light, that is, irrespective of the external illumination environment. In addition, also it is possible to achieve enhancement of the accuracy of image information such as, for example, enhancement of color information, acquired through the image pickup apparatus.

The wavelength distribution measuring section can be configured from a light reception device such as, for example, a photo-sensor. For control of the wavelength distribution measuring section, for example, a control circuit which has inputting and outputting sections and is configured from a CPU and a memory may be provided in the image display apparatus or the electronic apparatus which incorporates the image display apparatus. On the other hand, in an image display system wherein a peripheral apparatus such as a personal computer or an electronic computer is connected to the image display apparatus, the controlling function of the wavelength distribution measuring section may be provided in the peripheral apparatus.

It is to be noted that, in the case where blurring by diffraction is little, there is no necessity to carry out processing for correcting or compensating for diffraction of a picked up image. However, even in such an instance, if the wavelength distribution measuring section configured to measure the wavelength distribution of external light is further provided, then, for example, the diffraction correction unit can weight an image acquired by the image pickup apparatus with the wavelength distribution of the picked up image. As a result, enhancement in accuracy of image information acquired through the image pickup apparatus can be anticipated.

Light Transmitting Region

The light transmitting region provided on the image display section of the image display apparatus in the embodiments may be formed at a location corresponding to a location at which the image pickup apparatus is arranged, at least at a location positioned in front of the image pickup face of the image pickup apparatus. Then, the light transmitting region includes at least one light transmitting portion at which a very small opening through which light representative of an image of an image pickup object on the display face side is to pass is formed, preferably includes a plurality of light transmitting portions.

Here, the light transmitting region may be configured in a first configuration example wherein a light transmitting portion is provided in a plurality of pixels. Or, the light transmitting region may be configured in a second configuration example wherein a light transmitting portion is provided around at least more than one pixel, preferably around at least two or more pixels. In this instance, the light transmitting portion may be provided fully around the pixel or pixels or may be provided partly around the pixel or pixels, particularly along two or more contiguous sides from among sides which correspond to boundaries of the pixels. In the latter case, the light transmitting region is preferably provided over a length more than one fourth of the overall periphery of the pixel, that is, along two contiguous sides, the light transmitting region is preferably provided over more than one half the length of each one side.

In such a configuration as just described, light passing through the light transmitting portions provided in the plural pixels is condensed on the image pickup apparatus, or light passing through the light transmitting portion provided around at least more than one pixel is condensed on the image pickup apparatus. Accordingly, a very small lens of high accuracy is not required for forming an image on the image pickup apparatus accurately, and increase of the production cost of the image display apparatus with an image pickup apparatus is not invited. Further, a sufficient amount of light can be condensed on the image pickup apparatus.

While, in the case of the first configuration example, the light transmitting portion is provided for a plurality of pixels, preferably the light transmitting portion is provided, for example, for more than three pixels though not restricted to this. Further, the outer shape of the light transmitting portions which configure the light transmitting region can be determined substantially arbitrarily and may have a quadrangular shape such as a rectangle or a square.

In the case of the second configuration example, the light transmitting region includes a light transmitting portion provided around at least more than one pixel, and preferably provided, for example, around more than three pixels though not restricted to this. Further, the outer shape of the light transmitting portion may be determined substantially arbitrarily. For example, the light transmitting portion may be provided in an "L" shape such that it is provided along two contiguous sides from among the sides which correspond to the boundaries of the pixels. Or, the light transmitting portion may be provided in a U-shape such that it is provided along three contiguous sides from among the sides which correspond to the boundaries of the pixels. Or else, the light transmitting portion may be provided in a square framework shape such that it is provided along all of the sides which correspond to the boundaries of the pixels. Or otherwise, the light transmitting portion may be provided in a curb-like shape such that it is provided along all of the sides which correspond to the boundaries of the pixels and besides is provided commonly between adjacent ones of the pixels. Or, the light transmitting portion may be provided around a pixel group in which a projected image of a lens provided in the image pickup apparatus is included.

Image Pickup Apparatus

In the image display apparatus in the embodiments, although the image pickup apparatus may be arranged on the rear face side of the image display section, preferably the image pickup apparatus is arranged at a central portion of the image display section. The number of such image pickup apparatus may be one or a plural number. The image pickup apparatus may be configured using a known solid-state image pickup apparatus placed on the market which includes, for example, a CCD (charge coupled device) device or a CMOS (complementary metal oxide semiconductor) sensor.

The image display apparatus in the embodiments preferably includes a light condensing section provided between the image display section and the image pickup apparatus for condensing light having passed through the light transmitting portion in the light transmitting region on the image pickup apparatus. The light condensing section may be configured using a known lens. The lens may be configured from one of a biconvex lens, a plano-convex lens and a meniscus convex lens or from a reflecting mirror or a Fresnel lens or may be configured from a combination of the convex lenses, or may otherwise be configured from a combination of a concave lens and any of such convex lenses.

The image pickup apparatus may be configured using a known solid-state image pickup apparatus such as a video camera or a web camera on the market. In the case where such solid-state image pickup apparatus are used, the light condensing section and the image pickup apparatus are integrated with each other.

In the image display apparatus in the embodiments, preferably a color filter is not arranged on an optical path of light which enters the image display section, passes through the light transmitting portion, goes out from the image display section and enters the light condensing section. Further, it is preferable not to arrange an image forming system such as a microlens on the optical path.

Image Display Section

The image display section for use with the image display apparatus of the embodiments may be any image display section wherein a light transmitting portion can be formed between a gap between pixels, particularly between display portions of pixels. More particularly, the image display section may be any image display section wherein an electro-optical element whose luminance varies in response to a voltage applied thereto or current flowing therethrough is used as a display element of a pixel.

For example, a representative one of electro-optical elements whose luminance varies in response to a voltage applied thereto is a liquid crystal display element. Meanwhile, a representative one of electro-optical elements whose luminance varies in response to current flowing therethrough is an organic electroluminescence (hereinafter referred to as organic EL) element which may be an organic light emitting diode (OLED). An organic EL display apparatus which uses the latter organic EL element is a self-luminous display apparatus wherein a self-luminous light emitting element is used as a display element of a pixel. Meanwhile, a liquid crystal display element which configures a liquid crystal display apparatus controls transmission of light from the outside, that is, from the front face or the rear face. In the former case, the light may be external light. In the liquid crystal display apparatus, each pixel does not include a light emitting element.

In recent years, the interest in an organic EL display apparatus, for example, as a flat panel display apparatus (FP display apparatus) has increased. Although a liquid crystal display (LCD) apparatus occupies the mainstream as a FP display apparatus at present, it is not a self-luminance apparatus but uses such members as a backlight and a polarizing plate. Therefore, the LCD apparatus has problems that the FD display apparatus has an increased thickness and that the luminance is not sufficient. On the other hand, an organic EL apparatus is a self-luminance apparatus and does not require such members as a backlight in principle. Thus, the organic EL apparatus has a great number of advantages in comparison with the LCD apparatus that the thickness can be reduced readily and that the luminance is high. Particularly in an active matrix type organic EL display apparatus wherein a switching element is arranged in each pixel, the current consumption can be suppressed low by causing each pixel to be held in a light emitting state. Besides, with the active matrix type organic EL display apparatus, increase of the screen size and increase in definition can be carried out comparatively readily. Therefore, development of active matrix type organic EL display apparatus is proceeding in various companies, and the active matrix type organic EL display apparatus is expected to make the mainstream of a next-generation FP display apparatus.

As self-luminous display apparatus, a plasma display apparatus (PDP: Plasma Display Panel), a field emission display apparatus (FED), a surface-conduction electron-emitter display apparatus (SED) and so forth are available in addition to the organic EL display apparatus. Also the display apparatus mentioned can be applied to the image display section in the embodiments.

However, in the image display apparatus in the embodiments, the light emitting element of the image display section preferably is a self-luminous light emitting element, and more preferably is an organic EL element. In the case where the light emitting element is configured from an organic EL element, an organic layer, that is, a light emitting portion, which configures the organic EL element, includes a light emitting layer made of an organic light emitting material. In particular, the organic layer mentioned may be configured, for example, from a laminated structure of a hole transport layer, a light emitting layer and an electron transport layer, or another laminated structure of a hole transport layer and a light emitting layer serving also as an electron transport layer. Or, the organic layer may be configured from a further laminated structure of a hole injection layer, a hole transport layer, a light emitting layer, an electron transport layer and an electron injection layer.

In the case where an electron transport layer, a light emitting layer, a hole transport layer and a hole injection layer are formed as a "tandem unit," the organic layer may have a tandem structure of two stages wherein a first tandem unit, a connection layer and a second tandem unit are laminated. Or, the organic layer may have another tandem structure of three or more stages wherein three or more tandem units are laminated. In those cases, if the color of light to be emitted is made different among the different tandem units like red, green and blue, then an organic layer which generally emits white light can be obtained.

The organic layer may be optimized in thickness so that, for example, light emitted from the light emitting layer resonates between the first and second electrodes and part of the light is extracted to the outside through the second electrode.

In the case where the light emitting element of the image display section of the image display apparatus in the embodiments is formed from an organic EL element, the image display apparatus may be formed such that it includes a first substrate, a driving circuit provided on the first substrate, an interlayer insulating layer which covers the driving circuit, a light emitting section provided on the interlayer insulating layer, a protective layer provided on the light emitting section, a light blocking layer provided on the protective layer, and a second substrate which covers the protective layer and the light blocking layer.

Further, the image display apparatus may be formed such that each pixel includes a driving circuit and a light emitting portion; an opening is provided in the light blocking layer; a light transmitting portion is configured from the opening and a portion of the protective layer and a portion of the interlayer insulating layer which are positioned below the opening; and an image pickup apparatus is arranged on a face of the first substrate which does not oppose to the second substrate.

Here, as an array of pixels, for example, a stripe array, a diagonal array, a delta array and a rectangle array can be applied. Meanwhile, as the first or second substrate, various substrates are applicable including a high-strain point glass substrate, a soda glass ($Na_2O.CaO.SiO_2$) substrate, a borosilicate ($Na_2O.B_2O_3.SiO_2$) substrate, a forsterite ($2MgO.SiO_2$) substrate, a lead glass ($Na_2O.PbO.SiO_2$) substrate, various glass substrates having an insulating film formed on the surface thereof, a quartz substrate, a quartz substrate having an insulating film formed on the surface thereof, a silicon substrate having an insulating film formed on the surface thereof, or an organic polymer substrate may be applied. The organic polymer substrate may be made of polymethyl methacrylate (PMMA), polyvinyl alcohol (PVA), polyvinyl phenol (PV), polyethersulfone (PES), polyimide, polycarbonate, or polyethylene terephthalate (PET). The organic polymer substrate may have a form of a polymer material such as a plastic film, a plastic sheet or a plastic substrate made of a polymer material and having flexibility.

The driving circuit may be configured, for example, from one or a plurality of thin film transistors (TFTs) or the like. As a material for the interlayer insulating film, insulating resins such as $SiO_2$-based materials, SIN-based materials and polyimide like $SiO_2$, BPSG, PSG, BSG, AsSG, PbSG, SiON, SOG (spin-on glass), low-melting glass and glass paste can be used solely or in a suitable combination. In the case where a pixel is configured from an organic EL element, the light emitting portion is such as described hereinabove. As a material for configuring the protective film, preferably a material which is transparent with respect to light emitted from the light emitting portion and is so fine that water does not penetrate the same. Particularly, for example, amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous oxynitride ($\alpha$-SiON) or $Al_2O_3$ may be used. The light blocking film (black matrix) may be configured from a known material. As occasion demands, a color filter may be provided.

The image display section is formed from a plurality of pixel units each including a display element or light emitting element. If the number of such pixel units is represented by (M, N), several resolutions for image display such as the VGA (640, 480), S-VGA (800, 600), XGA (1024, 768), APRC (1152, 900), S-XGA (1280, 1024), U-XGA (1600, 1200), HD-TV (1920, 1080) and Q-XGA (2048, 1536) as well as (1920, 1035), (720, 480), (854, 480) and (1280, 960) can be used. However, the number of pixel units is not limited to any of the values given above.

In an image display section which carries out color display, one pixel unit is configured from three different pixels including, for example, a red pixel for displaying a red (R) color component, a green pixel for displaying a green (G) color component and a blue pixel for displaying a blue (B) color component. Or, one pixel unit may be configured from four or more different pixels such as, in addition to the three different pixels mentioned above, a pixel for displaying white light in order to enhance the luminance, a pixel or pixels for displaying a complementary color or colors for expanding the color reproduction range, a pixel for displaying yellow for expanding the color reproduction range and/or pixels for displaying yellow and cyan for expanding the color reproduction range.

The image display apparatus in the embodiments is an example of an electronic apparatus and may be configured such that an image pickup apparatus can be arranged on the rear face side of a display panel. The image pickup apparatus may be removably mounted on the image display apparatus or may be fixedly mounted on the image display apparatus.

It is possible to use the image display apparatus, for example, as an alternative of a monitor apparatus which configures a personal computer or as an alternative as a monitor apparatus incorporated in a notebook type personal computer. Further, the image display apparatus can be used as an alternative of a monitor apparatus incorporated in a portable telephone set, a personal digital assistant (PDA) or a game machine or a television receiver in the past.

<First Embodiment: Ready for the Reflection Noise Suppression Process>

General Configuration

Figure 1B:
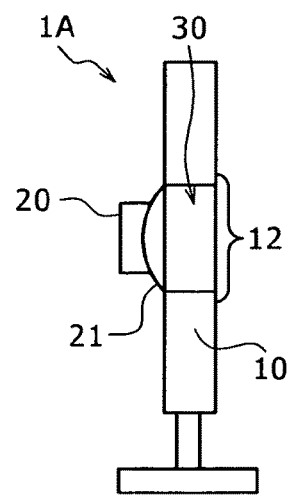
Figure 1C:
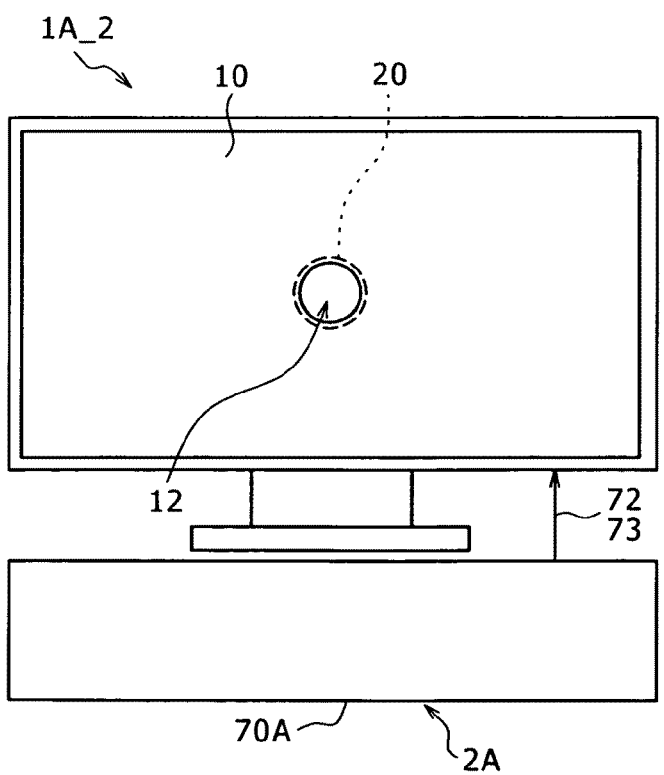
Figure 1D:
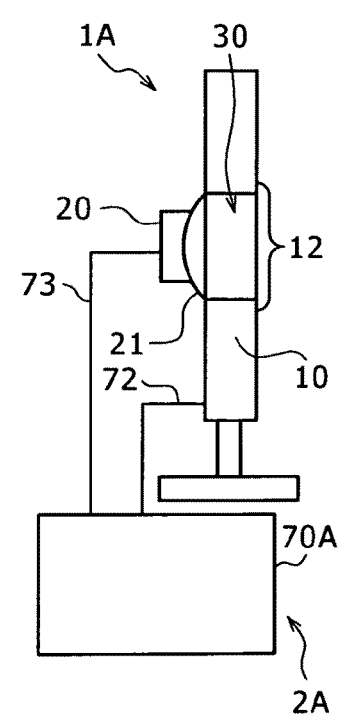
Figure 2:
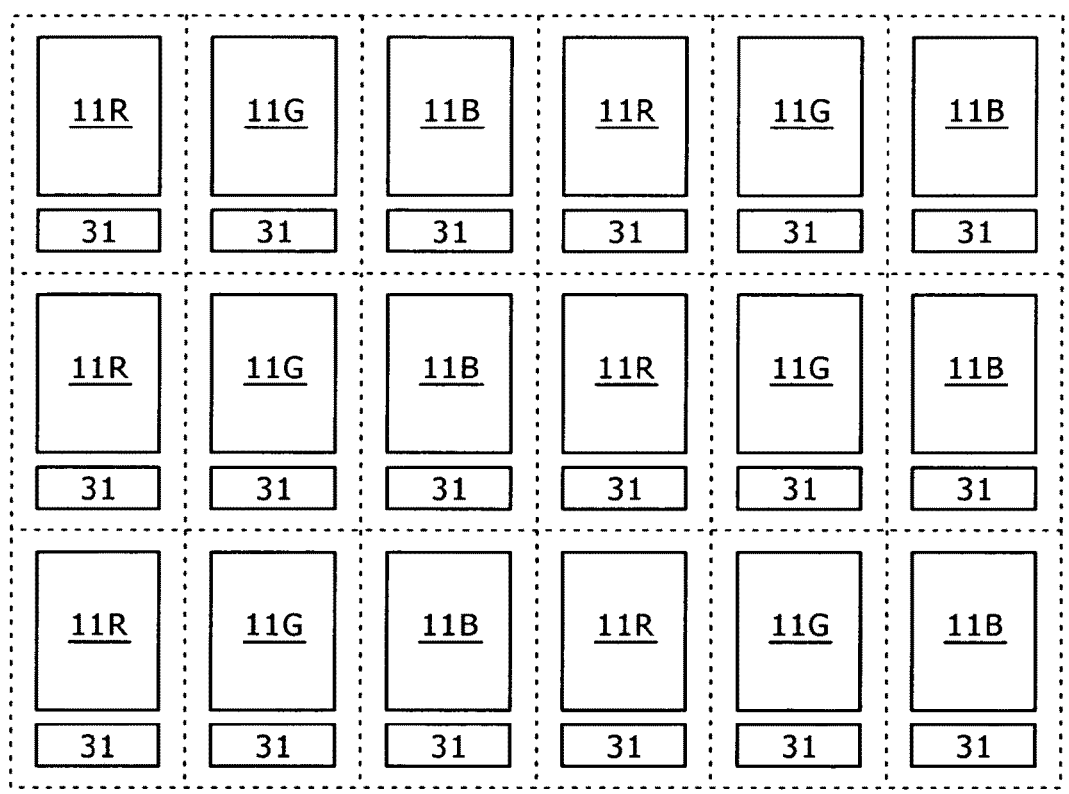
FIG. 2 is a schematic view illustrating the most typical arrangement of a plurality of pixels which configure an image display section.

FIGS. 1A to 1D and 2 illustrate a concept of an image display apparatus and an image display system according to the first embodiment. More particularly, FIG. 1A is a schematic view showing the image display apparatus as viewed from the front, and FIG. 1B is a schematic view showing the image display apparatus as viewed from a side. Further, FIG. 1C is a schematic view showing the image display system as viewed from the front, and FIG. 1D is a schematic view showing the image display system as viewed from a side. FIG. 2 is a view schematically illustrating the most typical arrangement of a plurality of pixels which configure an image display section.

Referring first to FIGS. 1A and 1B, the image display apparatus 1A of the first embodiment includes an image display section 10, an image pickup apparatus 20 arranged on the rear face side of the image display section 10, a light transmitting part 30 formed in the image display section 10, and a light condensing section 21 configured to condense light transmitted through the light transmitting part 30 on the image pickup apparatus 20. The image pickup apparatus 20 may be removably configured on the rear face of the image display apparatus 1A. A portion of the image display section 10 corresponding to the image pickup apparatus 20 is formed as a light transmitting region 12. For example, a portion of the image display section 10 at least corresponding to an effective image pickup region of the image pickup apparatus 20 is formed as the light transmitting region 12. In the case where the light transmitting region 12 is smaller than the effective image pickup region of the image pickup apparatus 20, the actual image pickup region of the image pickup apparatus 20 is narrowed.

The image pickup apparatus 20 is arranged on the rear face side of the image display section 10, more specifically at a central portion of the rear face side of the image display section 10. The number of such image pickup apparatus 20 as are actually provided is one. The image pickup apparatus 20 and the light condensing section 21 are formed from a known marketed video camera in which they are integrated with each other and which includes CCD elements.

The image display apparatus 1A is used, for example, as an alternative of a monitor apparatus which configures a personal computer. In particular, referring to FIGS. 1C and 1D, an image display system 2A of the first embodiment includes a image display apparatus 1A_2 and a peripheral apparatus 70A such as a main body of a personal computer or the like connected to the image display apparatus 1A_2. The peripheral apparatus 70A is an example of an electronic apparatus. This similarly applies also to the other peripheral apparatus 70 hereinafter described. The image display apparatus 1A_2 functions as a monitor apparatus of the peripheral apparatus 70A. The image display apparatus 1A_2 corresponds to the image display apparatus 1A from which some functioning sections are removed. The removed functioning sections are incorporated in the peripheral apparatus 70A. The peripheral apparatus 70A and the image display section 10 and image pickup apparatus 20 are connected to each other by cables 72 and 73, respectively.

As a pixel 11 of the image display section 10, a light emitting element of the self-luminous type, particularly an organic EL element, is used. The image display section 10 is formed from an organic EL display apparatus of the XGA type for color display. In particular, in the case where the number of pixel units is represented by (M, N), the number of pixels 11 is (1024, 768).

Referring to FIG. 2, one pixel unit is configured from three pixels including a red light emitting pixel 11R for emitting red light, a green light emitting pixel 11G for emitting green light and a blue light emitting pixel 11B for emitting blue light. It is to be noted that an outer edge of each pixel is represented by a broken line. This similarly applies also to the other examples hereinafter described.

The image display section 10 includes a plurality of pixels 11 (11R, 11G and 11B) arranged thereon and each including a display element, and a light transmitting portion 31 is provided in each of a plurality of pixels 11 in the light transmitting region 12 of the image display section 10. While, in the example of FIG. 2, different ones of the light transmitting portions 31 are provided individually for the pixels 11, this is not essential, but each light transmitting portion 31 may be provided over a plurality of pixels 11. Further, while, in the arrangement of FIG. 2, the light transmitting portion 31 is provided for each one pixel 11, or in other words, provided in all pixels 11 in the light transmitting region 12, this is not essential. In particular, a light transmitting portion 31 may be provided at least in each of a plurality of pixels 11 in the light transmitting region 12, and some of the pixels 11 in the light transmitting region 12 such as every three pixels may not include the light transmitting portion 31.

The light transmitting portion 31 is provided, for example, in 6×3=18 pixels 11 though not restricted to this. One light transmitting portion 31 is provided for one pixel. The light condensing section 21 condenses light transmitted through the light transmitting portions 31 of the 6×3=18 pixels 11 on the image pickup apparatus 20. The light transmitting portions 31 have a rectangular shape.

Though not shown, a scanning signal supplying IC for driving scanning lines and a video signal supplying IC for supplying a video signal are arranged on the image display section 10. A scanning line control circuit not shown is connected to the scanning signal supplying IC, and a signal line control circuit is connected to the video signal supplying IC. No color filter is arranged and no image forming system such as a microlens is arranged on an optical path of light which enters the image display section 10, passes through the light transmitting part 30, emerges from the image display section 10 and enters the light condensing section 21.

Arrangement Position of Image Pickup Apparatus

Figure 3A:
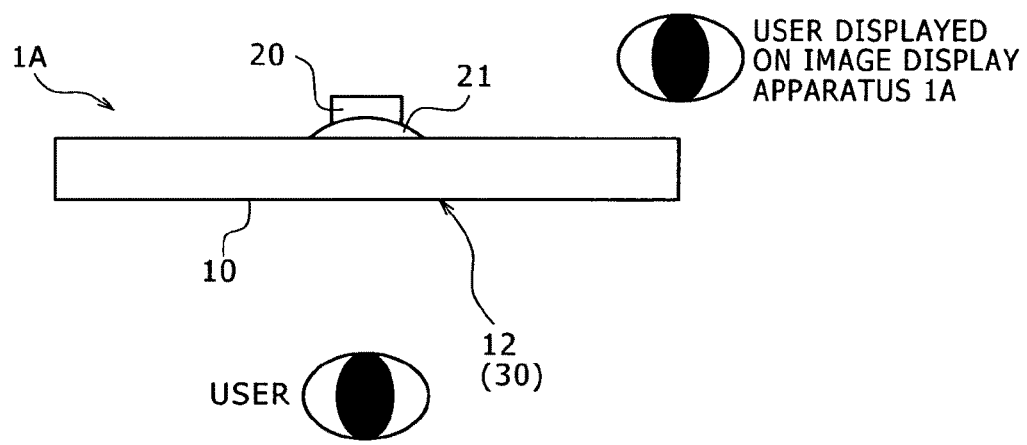
FIGS. 3A and 3B are schematic views illustrating a relationship between arrangement positions of an image pickup apparatus and an image displayed.

FIGS. 3A to 4B are schematic views illustrating a relationship between the arrangement position of the image pickup apparatus and a displayed image. In particular, FIG. 3A illustrates the relationship in the case of the image display apparatus 1 of the first embodiment, and FIG. 3B illustrates the relationship in the case of a image display apparatus 1X as a comparative example wherein an image pickup apparatus is secured to the outer side of the image display section. FIGS. 4A and 4B are schematic views illustrating image pickup by the image display apparatus 1A.

Figure 3B:
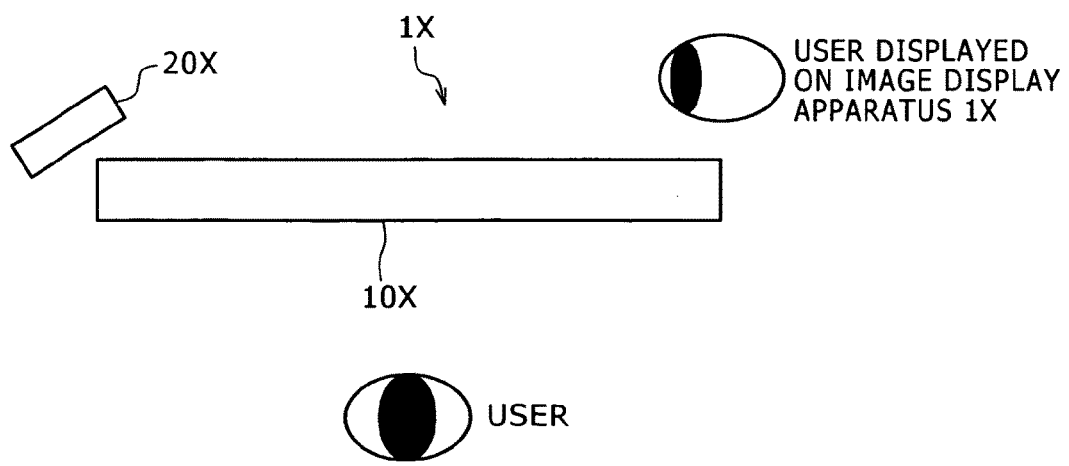

In the case where an image pickup apparatus 20X is secured to the outer side of an image display section 10X as seen in FIG. 3B, an image pickup apparatus 20X picks up an image of a user of the image display apparatus 1X from an oblique direction. Therefore, when the image is displayed on the image display section 10X, the image of the user picked up from the oblique direction is displayed on the image display section 10X. Accordingly, the face of the user cannot be displayed accurately, and also it is difficult to accurately decide at which location of the image display section 10X the user gazes. Furthermore, if the user comes close to the image display section 10X, the possibility that the image pickup range may be exceeded is high.

On the other hand, in the image display apparatus 1A of the first embodiment, since the image pickup apparatus 20 is disposed at a central portion of the rear face side of the image display section 10, the image pickup apparatus 20 can pick up an image of the user of the image display apparatus 1A from the front as seen in FIG. 3A. Therefore, when the image is displayed on the image display section 10, the image of the user picked up from the front is displayed on the image display section 10. Accordingly, it is possible to accurately display the face of the user, and it is possible to decide readily and accurately at which location of the image display section 10 the user gazes. Further, even in the case where the user comes close to the image display section 10, an image of the user can be picked up.

In the image display apparatus 1A, light transmitted through the light transmitting portions 31 provided individually in the pixels 11 in the light transmitting region 12 is condensed on the image pickup apparatus 20. Accordingly, a very small lens of high accuracy for accurately forming an image on the image pickup apparatus 20 is not required. Therefore, increase of the production cost of the image display apparatus 1A is not invited, and a sufficient amount of light can be condensed on the image pickup apparatus 20.

For example, FIG. 4A illustrates a state in which an observer, who is an image pickup object of the image pickup apparatus 20, points to a display image of the image display section 10 by means of a pen while observing the display image. The image pickup apparatus 20 is provided on the rear face of the image display apparatus 1A, that is, of the image display section 10, and can pick up an image of the face, the eyes and a hand of the observer opposing to the front of the display face and the pen as seen in FIG. 4B. Consequently, for example, the line of sight of the observer can be detected from the picked up image. Further, since a corresponding pointed point of the image display section 10 can be specified from the direction of the hand or the pen, a pointer function can be added readily to the image display apparatus 1A. Further, in addition to the pointer function, since the face or the eyes of the user, a movement of the hand, brightness around the user and so forth can be discriminated from the picked up image, it is possible to obtain various kinds of information from the image display apparatus 1A and signal the information to various systems. Consequently, the added value of the image display apparatus 1A can be raised.

Sectional Structure of Image Display Section

FIGS. 5A and 5B illustrate details of the image display section 10. In particular, FIG. 5A is a schematic partial sectional view of the image display section 10. Meanwhile, FIG. 5B is a table illustrating detailed features of a light emitting element of the image display section 10.

The image display section 10 includes a first substrate 40, a driving circuit configured from a plurality of TFTs provided on the first substrate 40, an interlayer insulating layer 41 which covers the driving circuit, and an organic layer 63 provided on the interlayer insulating layer 41 and serving as a light emitting portion. The image display section 10 further includes a protective layer 64 provided on the organic layer 63, a light blocking layer 65 provided on the protective layer 64, and a second substrate 67 which covers the protective layer 64 and the light blocking layer 65.

Each pixel 11 includes a driving circuit and a light emitting portion, and an opening 65A is provided in the light blocking layer 65. A light transmitting portion 31 is configured from the opening 65A, and a portion of the protective layer 64, a portion of a second electrode 62 and a portion of the interlayer insulating layer 41 which are positioned below the opening 65A. The light condensing section 21 and the image pickup apparatus 20 are disposed adjacent a face of the first substrate 40 which is not opposed to the second substrate 67.

More particularly, a driving circuit is provided on the first substrate 40 made of soda glass. The driving circuit is configured from a TFT formed from a gate electrode 51 formed on the first substrate 40, a gate insulating film 52 formed on the first substrate 40 and the gate electrode 51, source/drain regions 53 provided in a semiconductor layer formed on the gate insulating film 52, and a channel formation region 54 to which a portion of the semiconductor layer positioned above the gate electrode 51 between the source/drain regions 53 corresponds. While the TFT in the example described is of the bottom gate type, it may otherwise be formed as that of the top gate type.

The gate electrode 51 of the TFT is connected to a scanning line not shown. The interlayer insulating layer 41 (41A and 41B) covers the first substrate 40 and the driving circuit. Further, a first electrode 61 which configures an organic EL element is provided on the interlayer insulating film 41B which is made of $SiO_x$, $SiN_y$, a polyimide resin or the like. The TFT and the first electrode 61 are electrically connected to each other through a contact plug 42, a wiring line 43 and another contact plug 44 provided on the interlayer insulating film 41A. In FIG. 5A, one TFT is shown per one organic EL element driving section.

An insulating layer 45 having an opening 46 at the bottom of which the first electrode 61 is exposed is formed on the interlayer insulating layer 41. The insulating layer 45 is formed from an insulating material which is superior in flatness and besides has a low water absorption for preventing deterioration by water of the organic layer 63 to maintain an emitted light luminance, particularly from a polyimide resin. The organic layer 63 is formed along a portion of the insulating layer 45 surrounding the opening 46 from above the first electrode 61 exposed to the bottom of the opening 46 and having a light emitting layer made of an organic light emitting material. The organic layer 63 is configured from a laminated structure including, for example, a hole transport layer and a light emitting layer serving also as an electron transport layer. However, in FIG. 5A, the organic layer 63 is shown in one layer.

The insulating protective layer 64 made of amorphous silicon nitride ($\alpha$-$Si_{1-x}N_x$) is formed by plasma CVD (plasma-enhanced chemical vapor deposition) in order to prevent water from reaching the organic layer 63. The light blocking layer 65 made of a black polyimide resin is formed on the protective layer 64, and the second substrate 67 made of soda glass is arranged on the protective layer 64 and the light blocking layer 65. The protective layer 64 and light blocking layer 65 and the second substrate 67 are adhered to each other by a bonding layer 66 made of an acrylic-based bonding agent.

The first electrode 61 is used as the anode electrode, and the second electrode 62 is used as the cathode electrode. In particular, the first electrode 61 is made of a light reflecting material made of aluminum (Al) or silver (Ag) or an alloy of the metals and has a thickness of 0.2 μm to 0.5 μm. The second electrode 62 is made of a transparent conductive material such as ITO or IZO and has a thickness of 0.1 μm or is formed from a metal thin film of a thickness of approximately 5 nm made of silver (Ag) or magnesium (Mg) which transmits light by some degree therethrough, that is, from a translucent metal thin film. The second electrode 62 is not patterned but is formed as one sheet. As occasion demands, an electron injection layer not shown made of LiF and having a thickness of 0.3 nm may be formed between the organic layer 63 and the second electrode 62.

In summary, the light emitting element of the image display section 10 in the image display apparatus 1A of the present embodiment has such a particular configuration as illustrated in FIG. 5B.

The elements from the first substrate 40 to the protective layer 64 and light blocking layer 65 serve as the display element substrate. The second substrate 67 functions as a sealing substrate. The opening 65A provided in the second substrate 67 and serving as the light transmitting part 30 is provided at a portion of the display element substrate at which none of a pixel electrode (first electrode 61), a TFT (including the gate electrode 51) and a wiring line exists. Further, the protective layer 64 which functions as a sealant, the second electrode 62 which functions as an EL common electrode, the insulating layer 45 which functions as a pixel isolating film, the interlayer insulating layer 41 (41A, 41B) which functions as a planarizing insulating film, the source/drain regions 53 and the gate insulating film 52 have a light transmitting property. Accordingly, external light incident to the display face side, that is, to the second substrate 67 side, can reach the rear face, that is, the first substrate 40 side, through the opening 65A.

The image pickup apparatus 20 provided on the panel rear face is disposed such that the image pickup face thereof is positioned in the proximity of the panel rear face on which the light transmitting part 30, that is, the opening 65A, is provided. It is to be noted, however, that, in the present example, the light condensing section 21 is interposed between them. Therefore, external light incident to the display face side is focused by the lens not shown of the image pickup apparatus 20 and enters the solid-state image pickup element such as a CCD element or a CMOS element. Consequently, an image of an image pickup object existing on the display face side can be picked up.

Configuration Ready for Reflection Noise Suppression

Figure 6:
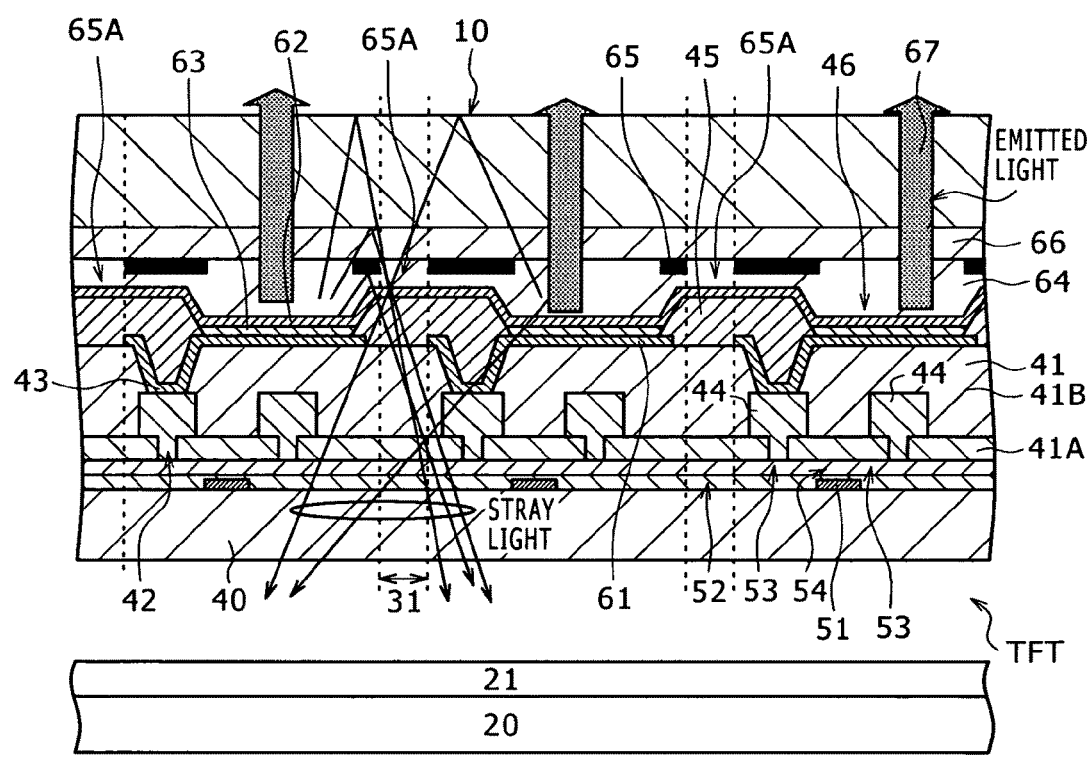
FIG. 6 is a schematic sectional view illustrating a reflection phenomenon.
Figure 7:
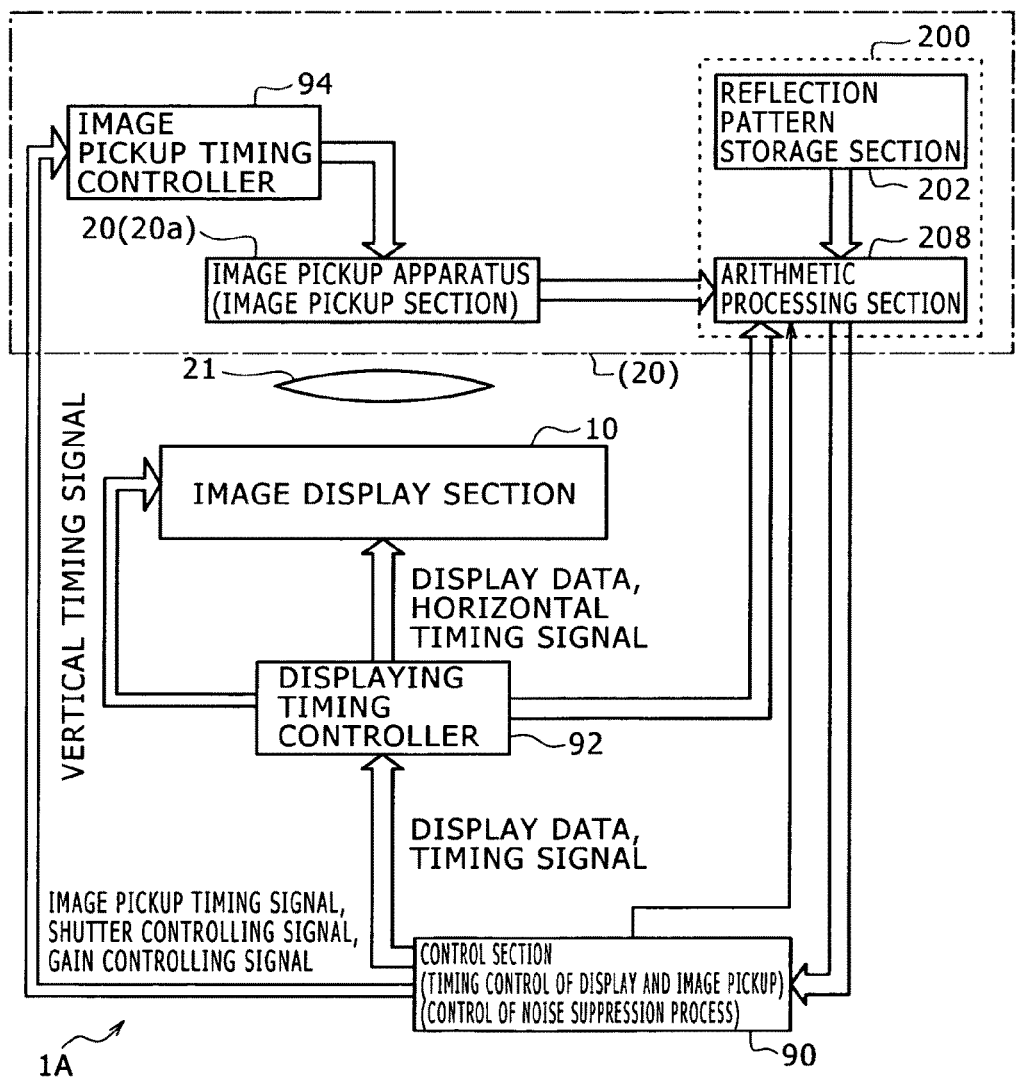
FIG. 7 is a block diagram of an image display apparatus according to a first embodiment.
Figure 8:
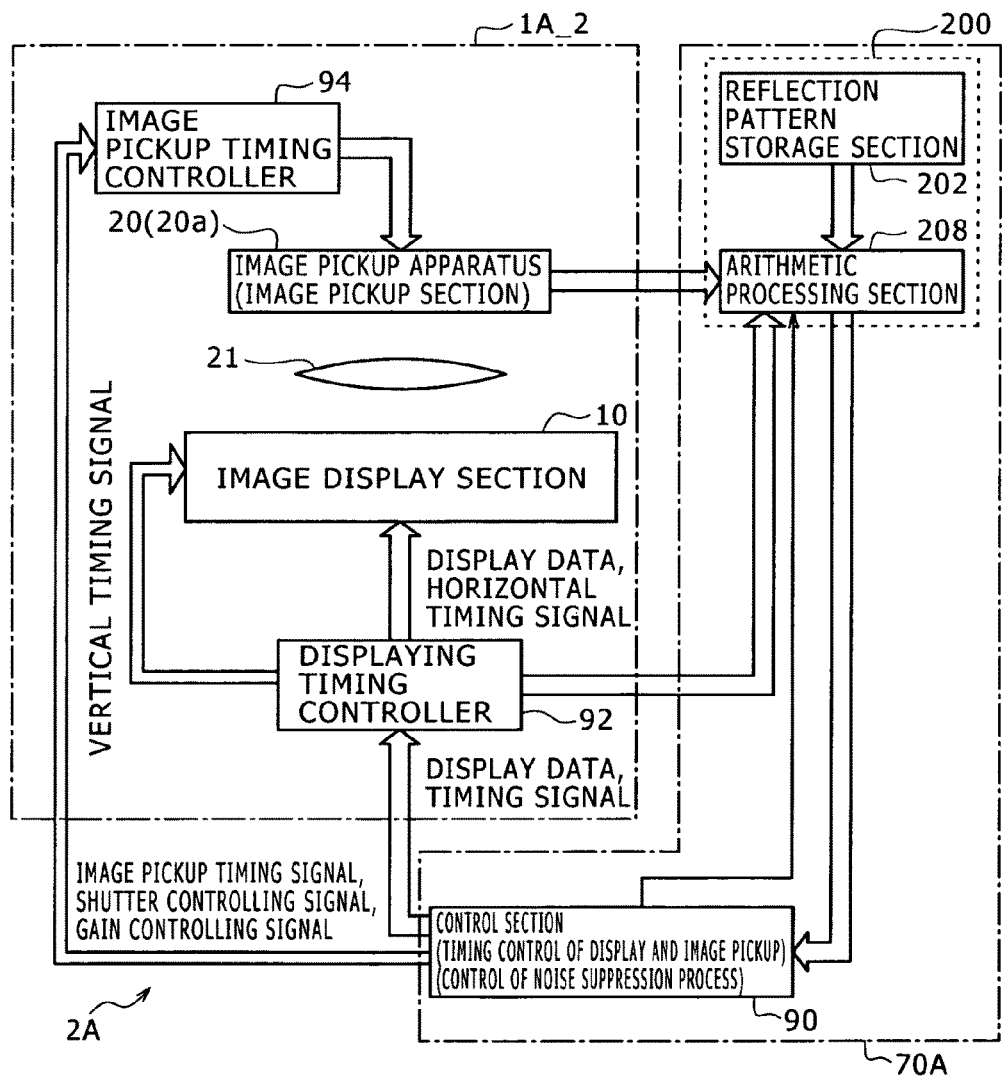
FIG. 8 is a block diagram of an image display system according to the first embodiment.

FIGS. 6 to 8 are schematic views illustrating a reflection phenomenon and a countermeasure against the reflection phenomenon. More particularly, FIG. 6 illustrates a reflection phenomenon, that is, a phenomenon that stray light which causes the phenomenon enters the image pickup apparatus 20 through the light transmitting part 30. FIG. 7 is a block diagram of the image display apparatus 1A of the first embodiment wherein an influence of a reflection phenomenon is corrected or suppressed from an aspect of signal processing. FIG. 8 is a block diagram of the image display system 2A of the first embodiment wherein an influence of a reflection phenomenon is corrected or suppressed from an aspect of signal processing.

In the image display apparatus 1A of the first embodiment, an organic EL element is used as a display element. Consequently, only if the light transmitting part 30 is provided, then an image of an image pickup object existing on the display face side, that is, on the second electrode 62 side, can be picked up by the image pickup apparatus 20 provided on the rear face side, that is, on the first substrate 40 side.

Although such a simple and convenient configuration as just described may not be impossible with an LCD apparatus, it is difficult, and a structure which transmits light including wavelengths of visible rays therethrough is further difficult. In contrast, the image display apparatus 1A of the first embodiment only includes the light transmitting part 30 and can pick up an image of an image pickup object existing on the display face side from the rear face side by a simple and convenient configuration.

Here, in the image display apparatus of the present embodiment, it was found that, if an image is picked up through the image display section on the rear face side of the image display section, then unique noise which does not appear when an image pickup is carried out without through the image display section appears with a picked up image. Thus, an investigation for the cause of appearance of such noise was conducted, and it was found that the noise is generated such that light from display elements of the image display section is reflected by various portions in the inside of the image display section and enters as stray light into the image pickup apparatus.

As seen in FIG. 6, the light blocking layer 65 in the image display section 10 has an opening 46 and an opening 65A. The image display section 10 has a top emission structure, and in the opening 65A, light emitted from the light emitting layer of the organic layer 63 passes through the second electrode 62, protective layer 64, bonding layer 66 and second substrate 67 and is emitted as emerging light from the display face. Meanwhile, the light transmitting portion 31 is configured from the opening 65A provided in the light blocking layer 65, and a portion of the protective layer 64, a portion of the second electrode 62 and a portion of the interlayer insulating layer 41 which are positioned below the opening 65A. The wiring line 43 is wired such that it does not interfere with the light transmitting portion 31.

Light emitted from the light emitting layer of the organic layer 63 is not emitted fully as emerging light from the display face, but part of the light is, for example, reflected by an interface between the bonding layer 66 and second substrate 67 or by an interface between the second substrate 67 and the air and returns to the inside, which makes stray light. If this stray light passes a gap of the opening 65A or the wiring line 43, then it can come to the image pickup apparatus 20 and be picked up as an image by the image pickup apparatus 20. Since the stray light is part of the light used for display by the image display section 10, an image similar to the displayed image is picked up by the image pickup apparatus 20. This phenomenon does not occur when an image is picked up without through the image display section 10.

In the case where reflection noise by stray light is little, there is no necessity to carry out a process of removing reflection components for a picked up image. However, in the case where a picked up image of high quality is required, it is preferable to correct an influence by a reflection phenomenon.

In the first embodiment, as a countermeasure against the reflection noise, the image display apparatus and the image pickup apparatus cooperate with each other so that an influence of reflection noise on a picked up image can be corrected from an aspect of signal processing thereby to achieve enhancement of quality of an image.

Incidentally, to which pixel or pixels of the image pickup apparatus 20 and by what degree of intensity part of light emitted from one of the pixels 11 of the image display section 10 and making stray light is picked up as an image rely upon the structure of the image display section 10, particularly upon the shape, size and arrangement of the associated members and the shape, size and distribution of the light transmitting portions. Accordingly, it is recommendable to measure in advance information (hereinafter referred to as reflection pattern data) of reflection for each pixel 11 of the image display section 10 to be picked up as an image by the image pickup apparatus 20, store the reflection pattern data into a predetermined storage section and then use the reflection pattern data in the reflection noise suppression process.

FIG. 7 shows the image display apparatus 1A of the first embodiment wherein an influence of a reflection phenomenon is corrected from an aspect of signal processing.

Referring to FIG. 7, the image display apparatus 1A of the first embodiment includes a control section 90 configured to control operation of the entire apparatus, a displaying timing controller 92 configured to control the displaying operation of the image display section 10, and an image pickup timing controller 94 configured to control the image pickup operation of the image pickup apparatus 20 or image pickup section 20a.

The control section 90 supplies display data, a timing signal and so forth to the displaying timing controller 92. Further, the control section 90 supplies an image pickup timing signal, a shutter controlling signal, a gain controlling signal and so forth to the image pickup timing controller 94.

The displaying timing controller 92 includes a signal line controlling circuit not shown, which supplies display data and a horizontal timing signal to the image display section 10 through a video signal supplying IC not shown. Further, the displaying timing controller 92 includes a scanning line controlling circuit not shown, which supplies a vertical timing signal to the image display section 10 through a scanning signal supplying IC not shown.

The image display apparatus 1A of the first embodiment includes a reflection noise suppression processing unit 200 for carrying out, for image information acquired through the image pickup apparatus 20, correction of reflection noise generated in the case where an image pickup is carried out through the light transmitting part 30 on the rear face side of the image display section 10. In the case where the image pickup apparatus 20 which is an example of an electronic apparatus is configured separately from the image display apparatus 1A, also the reflection noise suppression processing unit 200 (as occasion demands, also the image pickup timing controller 94) may be arranged on the image pickup apparatus 20 side as indicated by an alternate long and short dash line in FIG. 7.

The reflection noise suppression processing unit 200 includes a reflection pattern storage section 202 and an arithmetic processing section 208. Though not shown, the arithmetic processing section 208 includes a picked up image data storage section and a video data storage section. The processing operation of the reflection noise suppression processing unit 200 is controlled by the control section 90.

Information of reflection for each of the pixels 11 of the image display section 10 whose image is picked up by the image pickup apparatus 20 is measured in advance, and resulting reflection pattern data D202 are stored into the reflection pattern storage section 202.

The picked up image data storage section stores picked up image data D20 supplied thereto from the image pickup apparatus 20. The video data storage section fetches and stores video data D10 of the image display section 10 from the displaying timing controller 92 in synchronism with the image pickup timing of the image pickup apparatus 20.

The arithmetic processing section 208 refers to the reflection pattern data D202 stored in the reflection pattern storage section 202 and multiplies the picked up image data D20 (for each pixel) by a correction coefficient $\eta$ to determine a correction value. Then, the arithmetic processing section 208 subtracts the correction value from the picked up image data D20 (for each pixel) to remove reflection noise included in the picked up image data D20 stored in the picked up image data storage section. The correction coefficient $\eta$ is an index corresponding to the intensity of stray light and is specified from the reflection pattern data D202 measured in advance with respect to reference or standard device video data.

For example, in the case where the video data D10 of a pixel 11 corresponding to the correction coefficient $\eta$ makes reflection noise to the picked up image data D20 of the pixel 11 of the image pickup apparatus 20, the reflection noise can be corrected or eliminated by "D20−D10·η." The correction coefficient η is an index corresponding to the intensity of the stray light and is recommendable to be estimated or measured in advance from reference or standard device video data. It is to be noted that the correction coefficient η may be adjusted while a picked up image is confirmed so that the reflection noise may not be recognized.

The control section 90 accepts various instructions from the user and controls working of the reflection noise suppression processing unit 200 and other various functioning sections. For example, although various procedures for the reflection noise suppression process in the present embodiment are available as hereinafter described in detail, they are superior or inferior thereamong in terms of the processing speed and the noise suppression effect. Therefore, it is recommendable to make it possible to allow suitable selection of which one of the methods is to be adopted in accordance with an instruction of the user.

The control section 90 carries out various detection processes such as, for example, detection of the line of sight of the user or detection of a movement of a hand of the user from a processed image obtained by the reflection noise suppression processing unit 200, particularly by the arithmetic processing section 208. A result of such detection is reflected on the display by the image display section 10.

The control section 90 has a function of a timing controlling section configured to control the display timing of the image display section 10 and the image pickup timing of the image pickup apparatus 20 and controls image display of the image display section 10 and image pickup operation of the image pickup apparatus 20. For example, display data, a timing signal and so forth are sent from the control section 90 to the displaying timing controller 92 while display data and a horizontal timing signal are sent from the displaying timing controller 92 to the signal line controlling circuit not shown. Meanwhile, a vertical timing signal is sent to the scanning line controlling circuit not shown. Then, image display is carried out by the image display section 10 based on a known method.

On the other hand, an image pickup timing signal, a shutter controlling signal, a gain controlling signal and so forth are sent from the control section 90 to the image pickup timing controller 94. Those signals are sent from the image pickup timing controller 94 to the image pickup apparatus 20 so that operation of the image pickup apparatus 20 is controlled. At this time, preferably the control section 90 synchronizes the display timing of the image display section 10 and the image pickup timing of the image pickup apparatus 20 with each other.

Image information acquired through the image pickup apparatus 20 such as, for example, image information for each of red (R), green (G) and blue (B), is sent to the picked up image data storage section which configures the reflection noise suppression processing unit 200. At this time, the video data storage section simultaneously takes in and stores the video data D10 of the image display section 10, for example, video data for each of R, G and B, in accordance with the image pickup timing of the image pickup apparatus 20.

The arithmetic processing section 208 reads out the video data for each of R, G and B from the video data storage section and refers to the data to carry out mathematic operation of "D20−D10·η" for the picked up image data for each of R, G, B read out from the picked up image data storage section thereby to suppress reflection noise. Then, the arithmetic processing section 208 signals the picked up image data whose reflection noise is suppressed to the control section 90. Thereupon, processing taking not all signal components but some of the signal components into consideration may be carried out in order to simplify the calculation and reduce the processing time. This is hereinafter described in detail.

FIG. 8 shows the image display system 2A of the first embodiment wherein an influence of a reflection phenomenon is corrected from an aspect of signal processing. The image display system 2A is different from the image display apparatus 1A shown in FIG. 7 in that the control section 90 and the reflection noise suppression processing unit 200 are removed to form the image display apparatus 1A_2, and the removed control section 90 and reflection noise suppression processing unit 200 are incorporated in a peripheral apparatus 70A which is an example of an electronic apparatus.

In particular, the control section 90 may be provided in the image display apparatus 1A or may be provided in the peripheral apparatus 70A such as a personal computer connected to the image display apparatus 1A_2. Also the reflection noise suppression processing unit 200 may be provided in the image display apparatus 1A or may be provided in the peripheral apparatus 70A such as a personal computer connected to the image display apparatus 1A_2.

It is possible to implement the controlling function of the reflection noise suppression processing unit 200 or the control section 90 in the image display apparatus 1A or the image display system 2A, particularly the function of controlling the reflection noise suppression processing unit 200 by software, and a program therefor or a recording medium in or on which the program is stored may be extracted as a specific feature. This similarly applies also to a case in which a diffraction correction process hereinafter described is carried out and to another case in which improvement of the accuracy of image information acquired through the image pickup apparatus such as, for example, improvement of the accuracy of color information, and improvement of the accuracy of the MTF inverse transform process are achieved by reflecting a result of measurement of the wavelength distribution of external light.

In particular, in the present embodiment, the mechanism for a controlling configuration for carrying out a reflection noise suppression process, a diffraction correction process, a wavelength distribution measuring process and a controlling process relating to the processes is not limited to a configuration by a hardware processing circuit but can be implemented by software using a mechanism of a computer based on program codes which implement the functions. By the mechanism wherein the processes are executed by software, the processing procedure and so forth can be changed readily without involving a change in hardware. The program may be stored in and provided as a computer-readable storage medium or may be provided by distribution through wired or wireless communication means.

While the program is provided as a file which describes program codes for implementing various functions for the reflection noise suppression process, diffraction correction process, wavelength distribution measuring process and controlling process relating to the processes, in this instance, the program may be provided as a lump program file or may be provided as individual program modules suitable for a hardware configuration of a system configured from a computer.

Further, as particular means of the individual sections including functioning blocks for implement the functions for the reflection noise suppression process, diffraction correction process, wavelength distribution measuring process and controlling process relating to the processes, hardware, software, communication means, a combination of them and some other means can be used. This itself is self-evident to those skilled in the art. Further, the functioning blocks may be aggregated into a single functioning block. Further, the software for causing a computer to execute processing of the program is installed discretely in response to a mode of the combination.

Although the mechanism wherein the processes are executed by software can cope flexibly with parallel processes or a continuous process, as the processing becomes complicated, a drop of the processing speed makes a problem as the processing time becomes long. In contrast, if the mechanism is configured using a hardware processing circuit, then even if the processing is complicated, a drop of the processing speed is prevented. Consequently, an accelerator system which achieves high speed operation by which a high throughput is obtained is constructed.

Synchronization Control of Countermeasure Against Reflection Phenomenon

Figure 9:
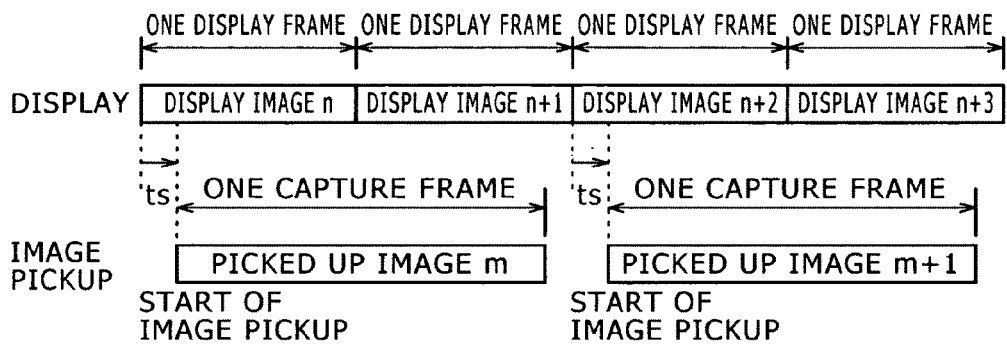
FIG. 9 is a diagrammatic view illustrating synchronization control suitable for use in the case where a technique of countermeasuring an influence of a reflection phenomenon from an aspect of signal processing.

FIG. 9 illustrates synchronization control suitable for use with a case in which a technique of countermeasuring an influence of a reflection phenomenon from an aspect of signal processing is adopted. More particularly, FIG. 9 illustrates an example of timings of image pickup and display.

According to the mechanism of the first embodiment, by starting image pickup at a particular timing within a display period of the display apparatus, a picked up image of high quality can be acquired while reflection of a display image on the picked up screen image is removed effectively.

While FIG. 9 illustrates a case in which a picked up image frame period is longer than a display frame period, this is a mere example, and the picked up image frame period may be shorter than the display frame period or the display frame period and the picked up image frame period may be equal to each other.

Upon starting of image pickup, video display and image pickup are synchronized with each other so that the image pickup may be started after time is from the start of display. For example, a shutter signal for the image pickup apparatus 20 is synchronized in accordance with a vertical synchronizing signal of a video signal. It is to be noted that the synchronization timing between display and image pickup may be certain time within a display period but is not essentially included within a non-displaying period such as a blanking period.

By establishing synchronism of the start of image pickup at particular time within a display period in this manner, even if a display image is reflected within an image pickup period, what display image is reflected on a picked up image can be decided readily from the video data 10 thanks to the synchronization. Therefore, reflection components can be removed readily from the picked up image, that is, from the picked up image data D20.

In contrast, if synchronism between image pickup and display is not established, then it is actually difficult to remove reflection on the picked up image although this is not impossible. Thus, the picked up image suffers from a flicker phenomenon, and this is conspicuous particularly in the case where the frame rates of image pickup and display are proximate to each other.

<Reflection Noise Suppression Process: First Example (Processing Area Reduction Method)>

Figure 10:
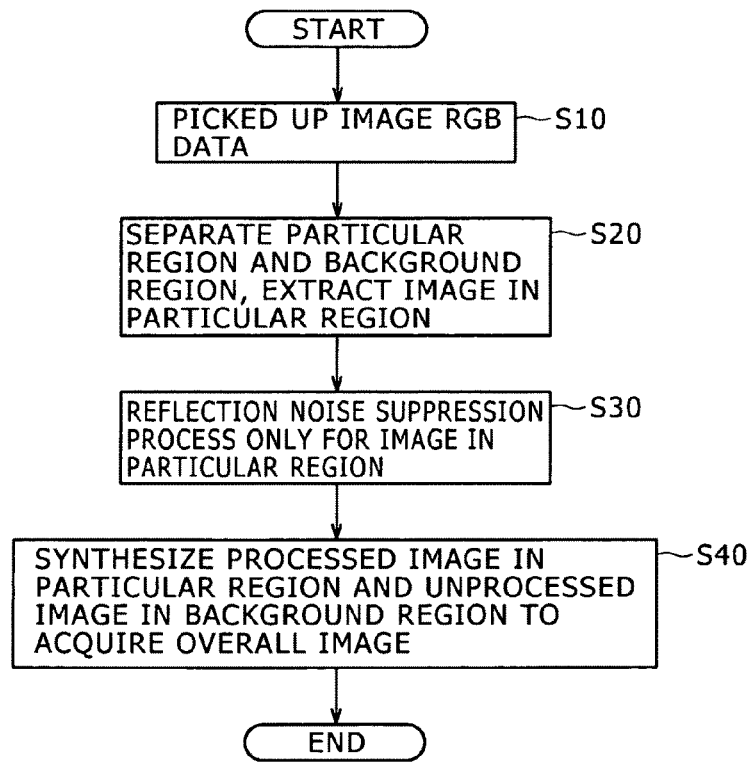
FIGS. 10, 11, 12 and 13 are flow charts illustrating first, second, third and fourth examples of a reflection noise suppression process, respectively.

FIG. 10 is a flow chart illustrating a first example of the reflection noise suppression process by the reflection noise suppression processing unit 200. The reflection noise suppression process of the first example applies a method of processing area reduction.

As an example, it is assumed that color image data of R, G and B, that is, picked up image R data, picked up image G data and picked up image B data, which are the video data D10, are supplied as picked up image data from the image pickup apparatus 20 to the reflection noise suppression processing unit 200 at step S10. The reflection noise suppression processing unit 200 stores the video data D10 supplied thereto from the image pickup apparatus 20 into the picked up image data storage section.

The arithmetic processing section 208 of the reflection noise suppression processing unit 200 separates the picked up image into a "particular region" and a "background region" to extract the "particular region" at step S20. For example, the arithmetic processing section 208 applies the "image pickup object-oriented method" to determine a region of part of the image pickup object, for example, a region of the face of the user, as a "particular region." The arithmetic processing section 208 thus separates the face and the other region from each other and extracts the face region. As an extraction algorithm for the face region, a known face detection method such as, for example, a Haar-like feature classification may be used. Incidentally, a rectangular region which includes the specified face is extracted. Naturally, the extracted face region has an area smaller than that of the entire picked up image.

The arithmetic processing section 208 removes an influence of reflection of the display image existing on the picked up image only from the extracted particular region at step S30. For example, in a TV conference, the picture quality of the facial expression or compression of a talking party is more significant than that of the background, and even with an image with regard to which reflection components are removed only from the face, TV conference parties can talk without an uncomfortable feeling.

The arithmetic processing section 208 synthesizes signal components of the extracted image of the face region, which is the particular region and for which the reflection noise reduction process has been carried out, and signal components of the image of the background region for which the reflection noise suppression process has not been carried out with each other at step S40, thereby completing the processing.

The extracted region or particular region, which is, in the present example, the face region, separated or extracted from the overall region of the picked up image has an area smaller than that of the overall picked up image. Therefore, the calculation amount is reduced in comparison with an alternative case in which the reflection noise suppression process is applied to the overall region of the picked up image, and the processing time is reduced. Consequently, the processing can be carried out at a higher speed. For example, in the case where the area of the particular region is equal to 1/X time that of the overall region, the processing speed is reduced to "α·X" times. α has a value lower than 1 and is an overhead amount by the process at step S20 of extracting a particular region from the overall region and the process at step S40 of synthesizing an image of the particular region for which the reflection noise suppression process has been carried out and an image of the background region for which the process has not been carried out.

<Reflection Noise Suppression Process: Second Example (All Signals are Targeted)>

Figure 11:
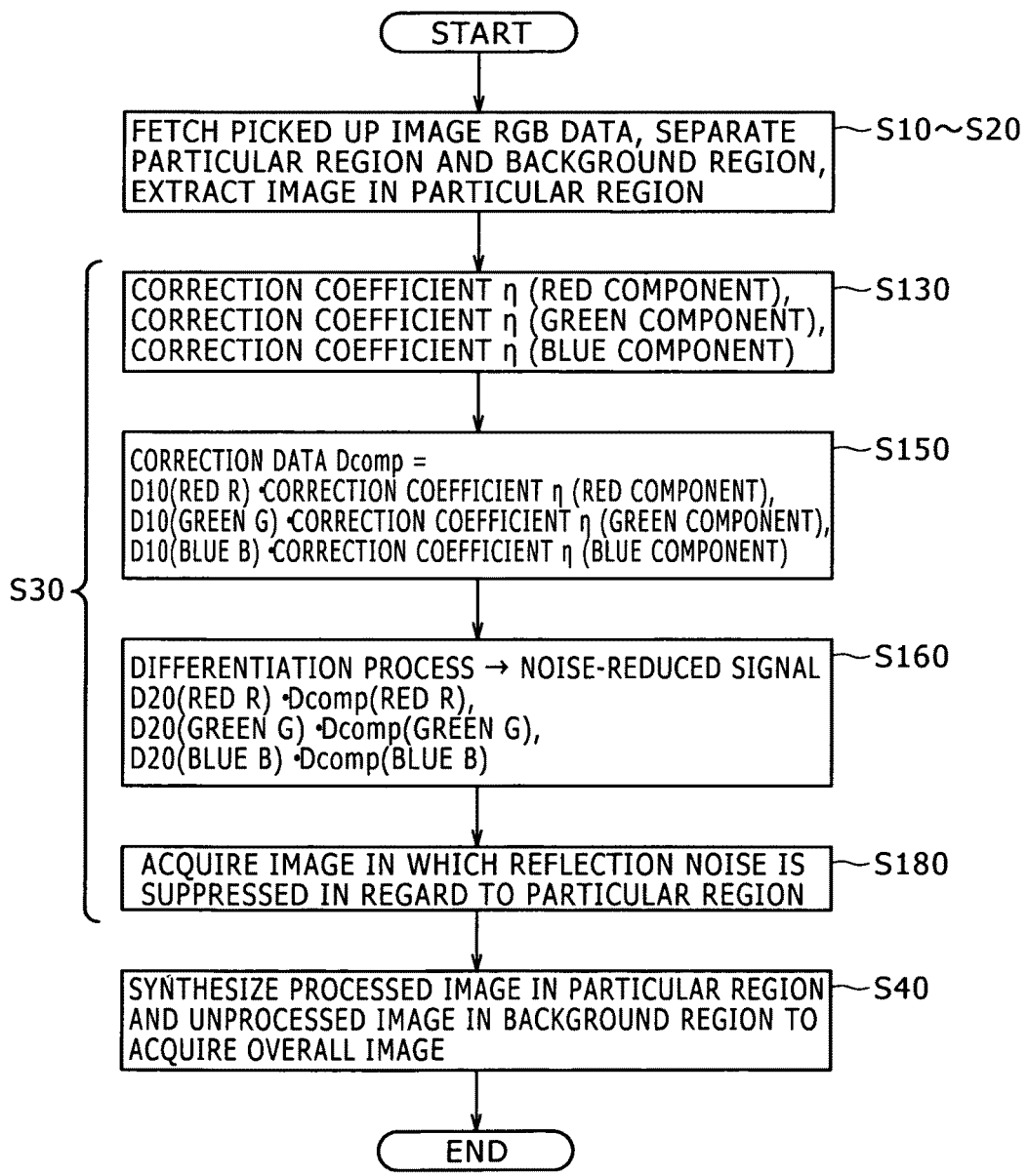

FIG. 11 is a flow chart illustrating a second example of the reflection noise suppression process by the reflection noise suppression processing unit 200. In the reflection noise suppression process of the second example, signal components which configure image information acquired by the image pickup apparatus 20 are processed.

In the following, description is given of an example wherein the second example is used together with the first example wherein only a particular region is determined as a processing target. However, this is not essential. This similarly applies also to the third and fourth examples hereinafter described. Referring to FIG. 11, the arithmetic processing section 208 removes an influence of reflection of a display image existing on a picked up image only from an extracted particular region at step S30. Thereupon, the arithmetic processing section 208 carries out the reflection noise suppression process individually for the color image data of R, G and B.

For example, the arithmetic processing section 208 refers to the reflection pattern data D202 stored in the reflection pattern storage section 202 to determine a correction coefficient for each of the colors of R, G and B, that is, for each pixel at step S130.

Then, the arithmetic processing section 208 multiplies, for each of the colors of R, G and B, the video data D10 by the corresponding correction coefficient η determined at step S130 to obtain correction data $D_{comp}$ for the picked up image data D20 at step S150.

The arithmetic processing section 208 corrects the video data D10 with the correction data $D_{comp}$ determined at step S150 for each of the colors of R, G and B, that is, subtracts, for each pixel of the picked up image, the correction data $D_{comp}$ from the video data D10, to acquire an image wherein reflection noise is suppressed for each color at step S160.

The arithmetic processing section 208 synthesizes the signal components of the extracted image in the particular region for which the reflection noise suppression process has been carried out and the signal components of the image in the background region for which the reflection noise suppression process has not been carried out with each other at step S40. Then, the processing is completed, that is, the resulting image is displayed on the image display section 10.

In the second example, the reflection noise suppression process is carried out for the signal components of R, G and B which configure image information. Therefore, although the processing load is high, the noise suppression is high in comparison with the alternative process in which attention is paid to some signal component, and noise which appears on a picked up image by a reflection phenomenon can be suppressed with a high degree of accuracy.

It is to be noted that, as a modification to the second example, a method may be adopted wherein a color space of picked up image data of components of image information acquired by the image pickup apparatus 20 is converted and processing is carried out for different ones of the image data after the color conversion. In this instance, the color conversion process increases the processing load. For example, in the case where an image is represented by three color components, for example, of R, G and B, by carrying out the reflection noise suppression process after the color conversion, the processing speed reduces to approximately 0.8 times due to a loss of 0.2 by the color conversion process. However, since the reflection noise suppression process is carried out after an image is decomposed into a luminance component and color components, there is an advantage that the correction coefficient η, or in other words, the noise suppression effect, can be made different between the luminance component and the color components. Further, since the reflection noise suppression process is carried out for the different signals which configure image information, the noise suppression effect is higher than that by an alternative process wherein attention is paid to some signal. Thus, noise which appears on the picked up image by a reflection phenomenon can be corrected with a high degree of accuracy.

<Reflection Noise Suppression Process: Third Example (Particular Signal-Oriented Process: Green Having High Correlation with Luminance Signal Component)>

Figure 12:
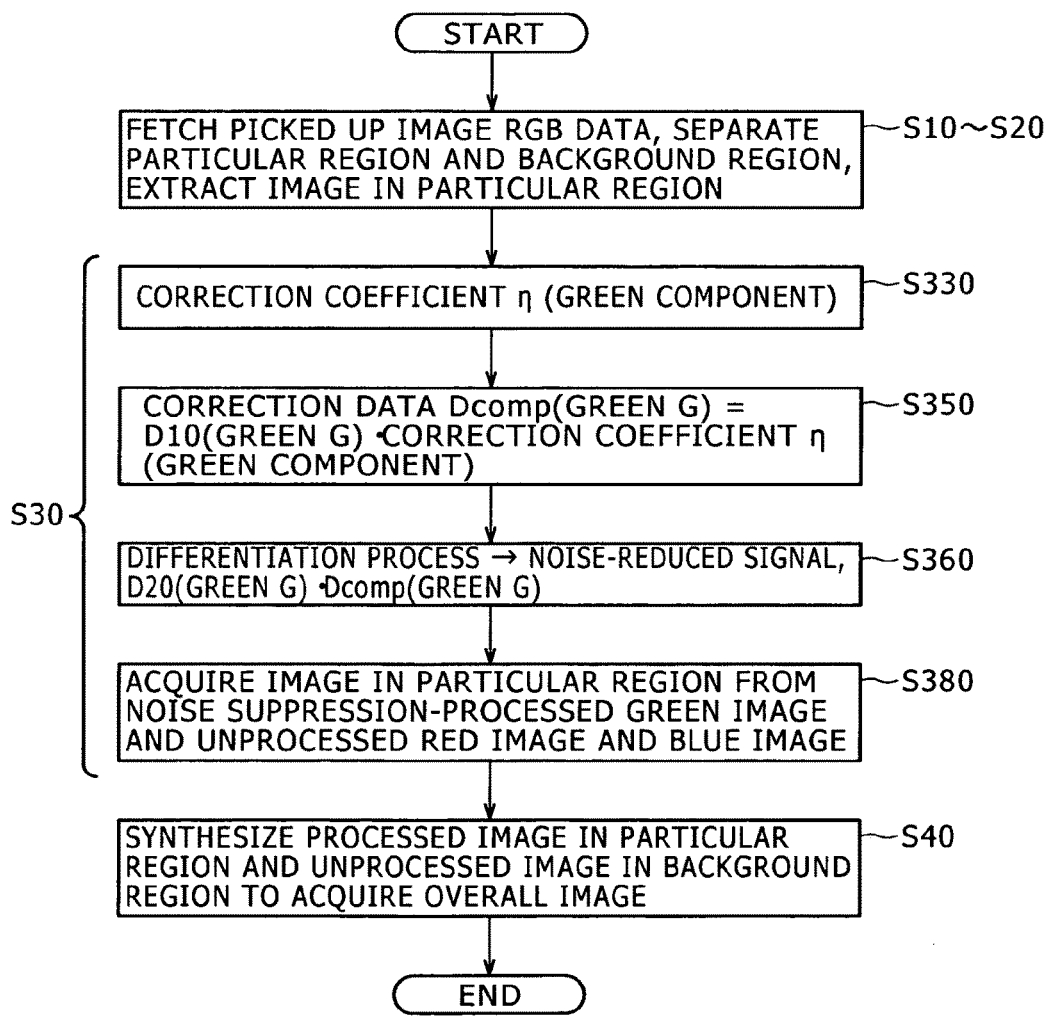

FIG. 12 is a flow chart illustrating a third example of the reflection noise suppression process by the reflection noise suppression processing unit 200. In the reflection noise suppression process of the third example, the particular signal-oriented method wherein at least one, but not all, of a plurality of signal components of image information acquired by the image pickup apparatus 20 is processed is applied.

In the following, an example is described wherein processing is carried out paying attention to only one of a plurality of signal components of image information such as, for example, signal components of R, G and B, or of X, Y and Z or Y, u, v after color conversion. The following description is given principally of differences from the second example. It is to be noted that processing steps are denoted by step numbers of the level of 300, and processing steps similar to those in the second example are denoted by numbers of the level of ten same as those in the second example.

The arithmetic processing section 208 carries out the reflection noise suppression process only for one of the colors of R, G and B. Thereupon, preferably attention is paid to green image information which has a relatively high correlation with a luminance signal component to carry out the processing. In short, the reflection noise suppression is carried out only with regard to the green which has a high correlation with a luminance signal component.

For example, the arithmetic processing section 208 refers to the reflection pattern data D202 stored in the reflection pattern storage section 202 to determine the correction coefficient η for the color of G for each pixel at step S330.

The arithmetic processing section 208 multiplies the video data D10, with regard to the color G, by the correction coefficient η determined at step S330 to obtain correction data $D_{comp}$ for the picked up image data D20 at step S350.

The arithmetic processing section 208 corrects the video data D10 for the color G with the correction data $D_{comp}$ determined for the color G at step S350, for example, subtracts the correction data $D_{comp}$ from the video data D10 for each pixel of the picked up image, to acquire a green image whose reflection noise is suppressed at step S360.

The arithmetic processing section 208 acquires, at step S380, a color image based on the green image acquired at step S360 and having the suppressed reflection noise, and the picked up image R data of the color R and picked up image B data of the color B, which have not been processed as yet.

According to the third example, the reflection noise suppression process is carried out with regard to at least one, but not all, of the colors of R, G and B which configure image information. Therefore, although the third example is inferior in noise suppression effect in comparison with the second example wherein all signal components are processed, the processing load is reduced and higher speed processing, can be anticipated. For example, in the case where an image is represented by signals of three color components of R, G and B, the processing speed increases to three times by carrying out processing in which attention is paid to one color.

Further, by using both of the "processing area reduction method" and the "particular signal-oriented method," an effect, that is, the processing speed of α·X times, by the reflection noise suppression process only for an extracted particular region is added. Therefore, the overall processing time can be reduced significantly.

In the third example, it seems recommendable to carry out processing paying attention to the color R or the color B. However, by carrying out processing paying attention to green image information which has a comparatively high correlation with a luminance signal component, a noise suppression effect which is not inferior in comparison with the second example wherein processing is carried out for all signal components is achieved. A noise suppression effect which is good in balance from both aspects of the noise suppression effect and the processing load is implemented. When compared with the fourth example hereinafter described, since the third example does not involve a color conversion process, the processing load is lower than that in the fourth example.

<Reflection Noise Suppression Process: Fourth Example (Particular Signal-Oriented Process: Luminance Signal Component)>

Figure 13:
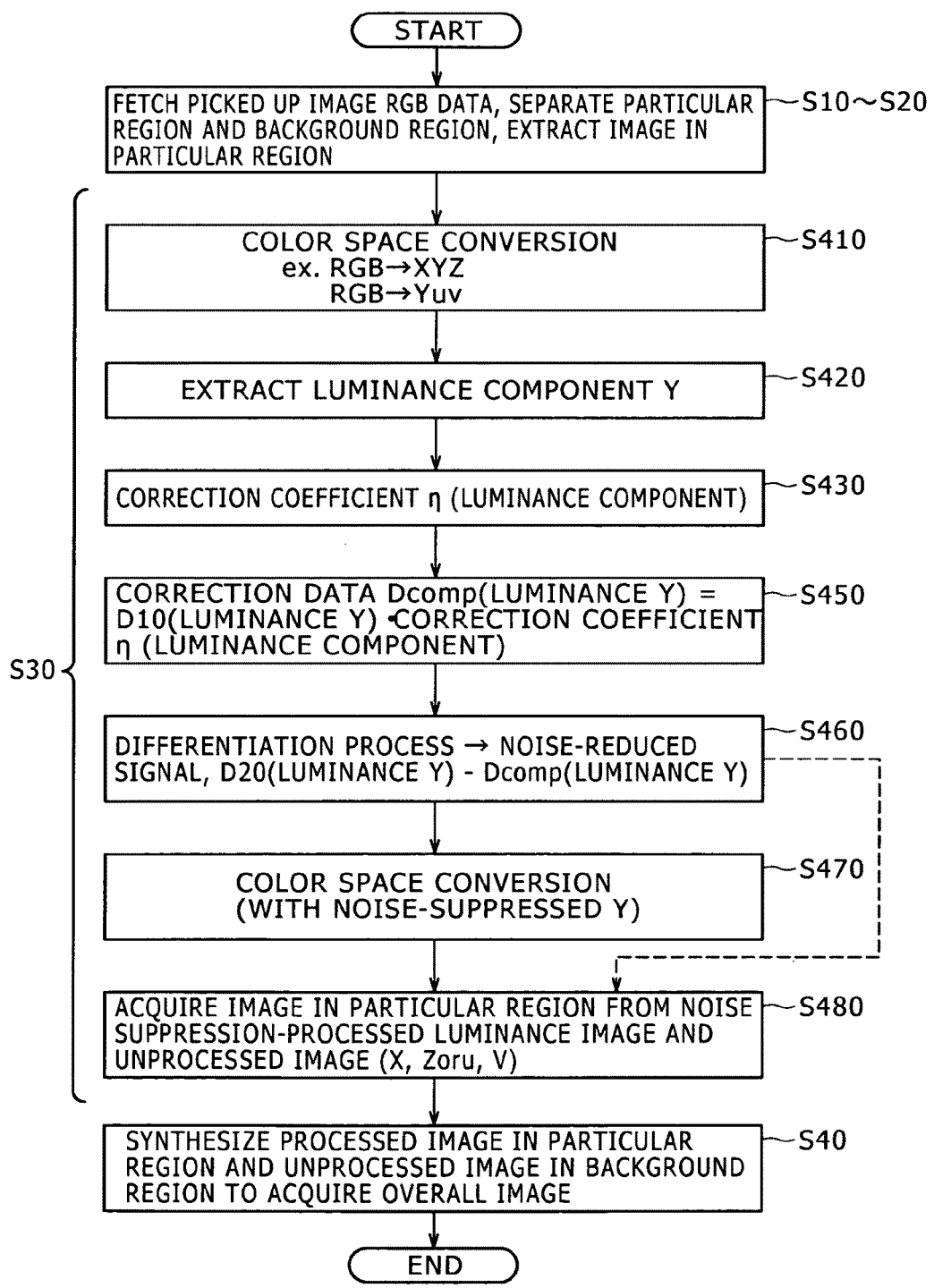

FIG. 13 is a flow chart illustrating the fourth example of the reflection noise suppression process by the reflection noise suppression processing unit 200. The fourth example is a method wherein a color space of image data of different components of image information acquired by the image pickup apparatus 20 is converted and processing is carried out at least with regard to one, but not all, of a plurality of image data after the color conversion. In the following, a process is described in which attention is paid only to one of a plurality of image data after the color conversion such as X, Y, Z image data or Y, u, v image data. It is to be noted that processing steps are denoted by step numbers of the level of 400, and processing steps similar to those in the second example are denoted by numbers of the level of ten same as those in the second example.

The arithmetic processing section 208 carries out the reflection noise suppression process only for an extracted particular region to remove an influence of reflection at step S30. Thereupon, the arithmetic processing section 208 converts picked up R data, picked up G data and picked up B data of the RGB color space regarding an image in the extracted particular region into image data in a different color space such as, for example, an XYZ color space or a Yuv color space at step S410.

Although, in the present example, the color space conversion process is carried out after image information in the particular region is extracted first, conversely the image information in the particular region may be extracted after the color space conversion process is carried out first for the overall image region acquired by the image display section 10. In the latter case, the processing amount increases and the required conversion processing time increases in comparison with the alternative case wherein the color space conversion process is carried out only for the image information in the particular region. Taking this into consideration, the former method is adopted in the present example.

The arithmetic processing section 208 carries out the reflection noise suppression process only for one of a plurality of image data after the color conversion in step 410 acquired by the image display section 10. In particular, the reflection noise suppression process is carried out only with regard to one signal component. Thereupon, processing is carried out paying attention to the luminance signal component. In particular, the arithmetic processing section 208 extracts a luminance signal component from a plurality of image data after the color conversion at step S420 and carries out the reflection noise suppression process only for the luminance signal component. The following description is given under the assumption that image data are those in the XYZ color space by color conversion from the RGB color space.

For example, the arithmetic processing section 208 refers to the reflection pattern data D202 stored in the reflection pattern storage section 202 to determine a correction coefficient q for the luminance component Y for each pixel at step S430.

The arithmetic processing section 208 multiplies the video data D10 regarding the luminance component Y by the correction coefficient η determined at step S430 to obtain correction data $D_{comp}$ for the picked up image data D20 at step S450.

The arithmetic processing section 208 corrects the video data D10 of the luminance component Y with the correction data $D_{comp}$ determined at step S450 with regard to the luminance component Y, particularly subtracts the correction data $D_{comp}$ from the video data D10 for each pixel of the picked up image, to acquire an image of the luminance component Y whose reflection noise is suppressed at step S460.

The arithmetic processing section 208 converts the image of the luminance component Y, which was acquired at step S460 and whose reflection noise is suppressed and the conversion X data X and the conversion Z data Z which have not been processed into an original image in the RGB color space, that is, into image data in the RGB color space at step S470. Consequently, a red image, a green image and a blue image whose reflection noise is suppressed are acquired.

The arithmetic processing section 208 acquires, at step S480, a color image based on the color image R, green image G and blue image B acquired individually for the different colors of R, G and B, respectively, at step S470. Alternatively, the color image may be acquired directly omitting the color conversion process at step S470.

According to the fourth example, although the processing load is high because the color conversion process is carried out, since the reflection noise suppression process is carried out for at least one, but not all, of the signal components after the color conversion, the processing load is reduced in comparison with the alternative case in which processing is carried out for all signal components. Accordingly, although the noise reduction effect is inferior in comparison with the alternative case in which processing is carried out for all signal components, the processing load is inclined to decrease as a whole and high speed processing can be anticipated.

In the fourth example, if the reflection noise suppression process is carried out only for a luminance signal component, then a noise suppression effect which is not inferior in comparison with the alternative case in which processing is carried out for all signal components is obtained. The reflection noise suppression process is balanced well from both aspects of the correction effect and the processing load.

Summary of First to Fourth Examples

As understood from the foregoing description, the noise suppression process in the first embodiment may be carried out in various procedures such as those, for example, described in the description of the first to fourth examples described above. However, the procedures are superior or inferior thereamong in terms of the processing speed and the noise suppression effect. Accordingly, it is recommendable to make it possible to allow suitable selection of which one of the methods is to be adopted by the user.

<Second Embodiment: Configuration Ready for Reflection Noise Suppression Process+Configuration Ready for Diffraction Correction>

Configuration Ready for Diffraction Correction

Figure 14:
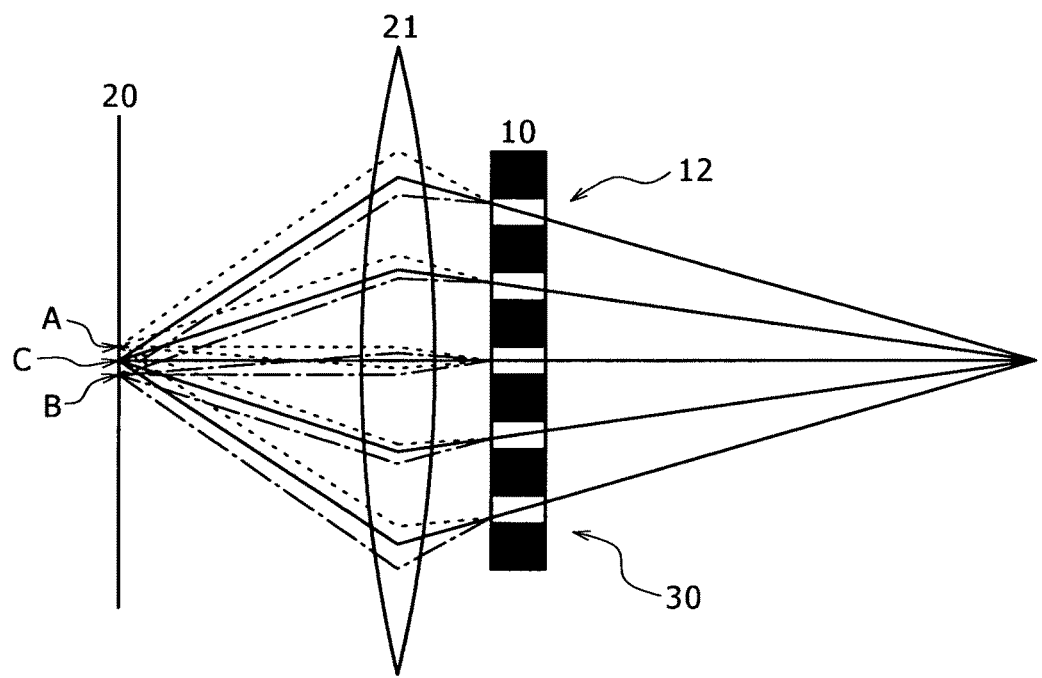
FIG. 14 is a schematic view illustrating an influence of a diffraction phenomenon on a picked up image.

FIGS. 14 to 17 are views illustrating a diffraction phenomenon and a countermeasure against the diffraction phenomenon. In particular, FIG. 14 is a schematic view illustrating an influence of a diffraction phenomenon on a picked up image.

Figure 15A:
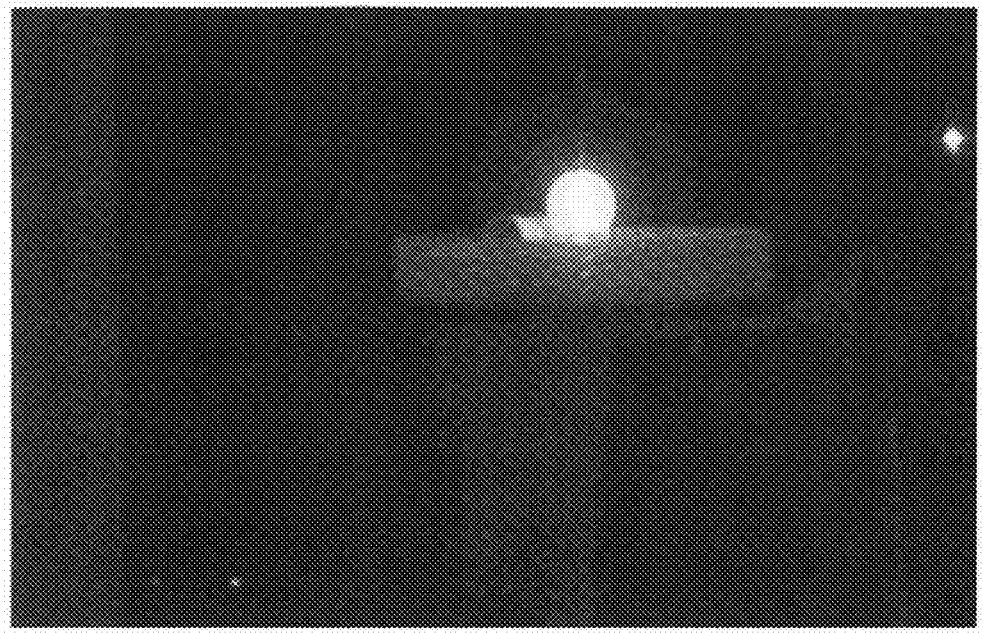
FIGS. 15A and 15B are views illustrating examples of an image picked up with a glass plate arranged in front of the image pickup apparatus.
Figure 15B:
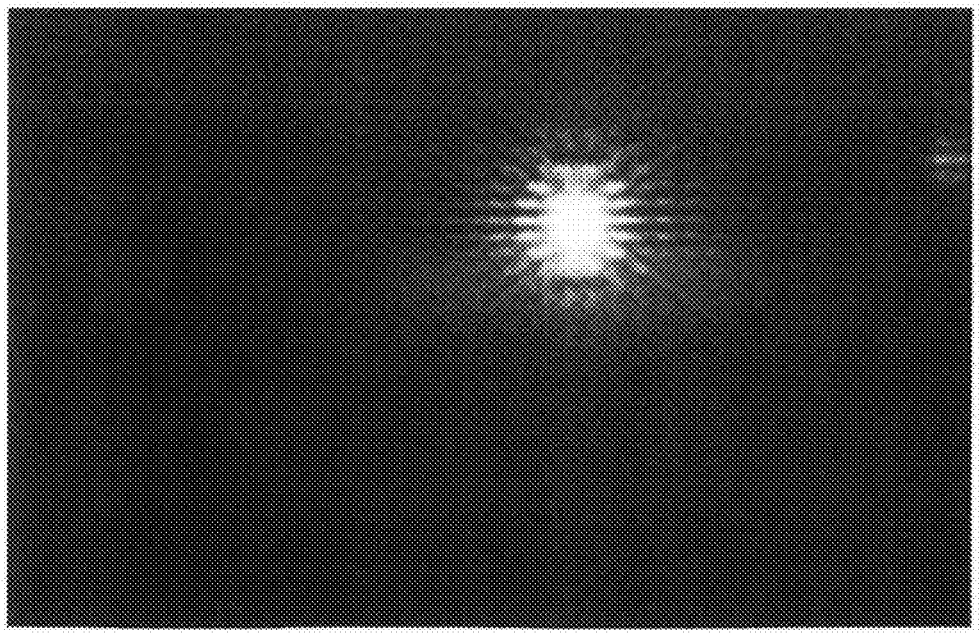
Figure 16:
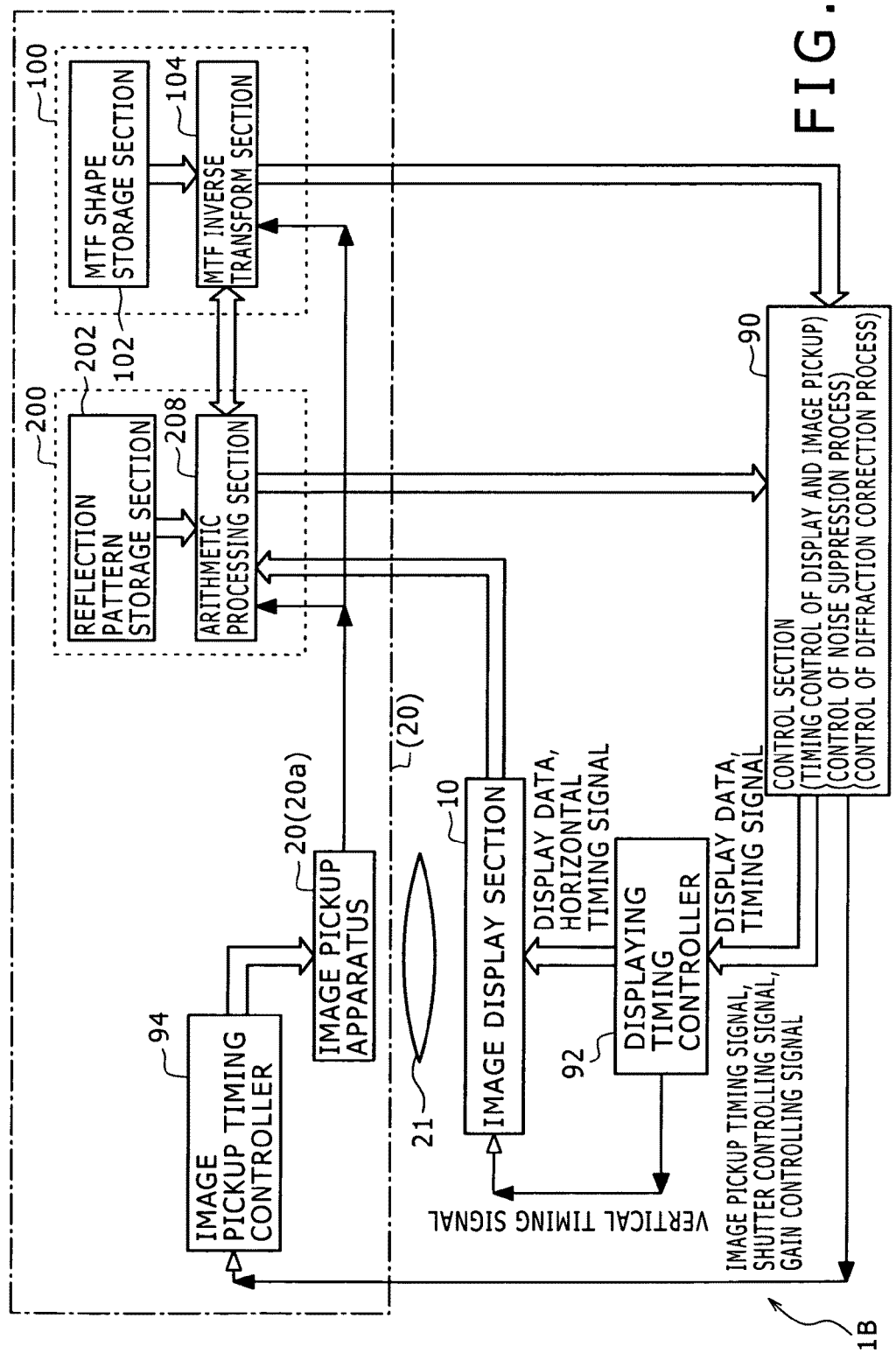
FIG. 16 is a block diagram of an image display apparatus according to a second embodiment.
Figure 17:
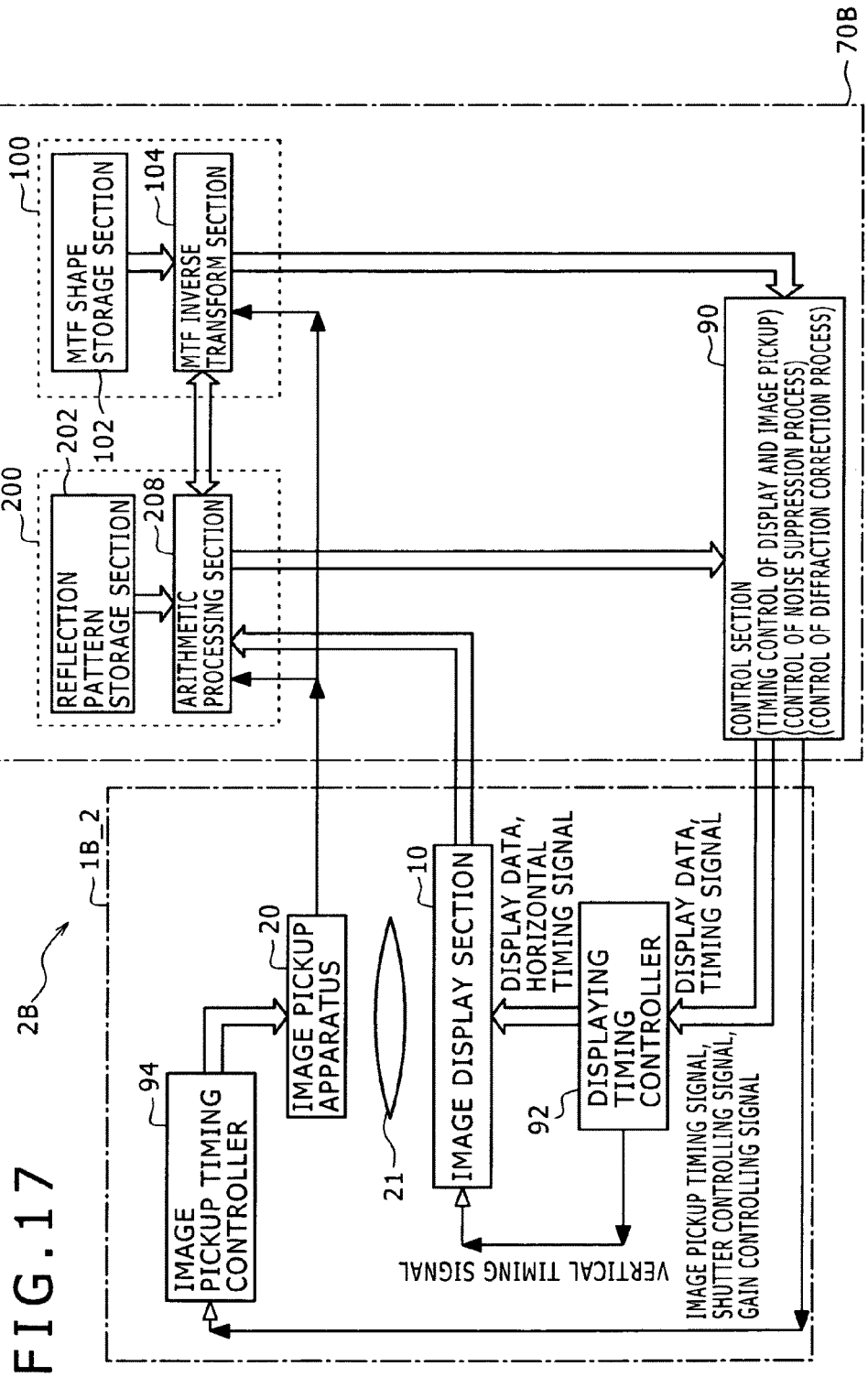
FIG. 17 is a block diagram of an image display system according to the second embodiment.

FIGS. 15A and 15B are views illustrating examples of an image picked up with a glass plate arranged in front of the image pickup apparatus 20. FIG. 16 is a block diagram of the image display apparatus 1B of the second embodiment wherein an influence of a diffraction phenomenon is corrected or compensated for from an aspect of signal processing. FIG. 17 is a block diagram of the image display system 2B of the second embodiment wherein an influence of a diffraction phenomenon is corrected or compensated for from an aspect of signal processing.

Generally, in the case where an image is picked up through a certain small light transmitting opening, a diffraction phenomenon appears at the light transmitting opening. In particular, it is assumed that the image pickup apparatus 20 is installed on the rear face of an article, that is, the image display section 10, on which a plurality of very small light transmitting portions 31 are provided at a predetermined pitch and then an image is picked up through the light transmitting portions 31 as seen in FIG. 14. In this instance, the light transmitting portions 31 act as optical slits. Therefore, an image same as an image "C" appears as an image "A" and another image "B" at an equal pitch as a result of a diffraction phenomenon, and consequently, the image suffers from blurring.

An image obtained by pickup with a transparent glass plate, which does not have a light transmitting portion, arranged in front of the image pickup apparatus 20 is shown in FIG. 15A. Another image obtained by image pickup with a transparent glass plate, in which light transmitting portions having a certain shape, size and distribution are provided, arranged in front of the image pickup apparatus 20 is shown in FIG. 15B. Blurring is found on the image shown in FIG. 15B. On the other hand, no blurring is found on the image shown in FIG. 15A.

The intensity and distribution of diffraction light depend upon the shape, size and distribution of the light transmitting portions and the wavelength of incident light, that is, external light. In the case where the amount of blurring by diffraction is small, there is no necessity to carry out a process of correcting or compensating for diffraction of the picked up image. However, in the case where a picked up image of high quality is required, preferably an influence of the diffraction phenomenon is corrected or compensated for.

FIG. 16 shows the image display apparatus 1B of the second embodiment wherein an influence of a diffraction phenomenon is corrected from an aspect of signal processing in addition to the configuration of the first embodiment wherein an influence of reflection noise is suppressed from an aspect of signal processing.

Referring to FIG. 16, the image display apparatus 1B of the second embodiment includes a diffraction correction unit 100 for applying correction or compensation for diffraction caused by the light transmitting part 30 to image information acquired through the image pickup apparatus 20. The diffraction correction unit 100 includes an MTF shape storage section 102 and an MTF inverse transform section 104. The MTF inverse transform section 104 has an image storage memory not shown and stores picked up image data supplied thereto from the image pickup apparatus 20. The processing operation of the diffraction correction unit 100 is controlled by the control section 90.

It is to be noted that, in the case where the reflection noise suppression process is executed first and then the diffraction process is executed as described hereinabove in connection with the first embodiment, image information for which the processing by the arithmetic processing section 208 has been carried out is supplied to the MTF inverse transform section 104. On the other hand, in the case where the diffraction correction process is executed first and then the reflection noise suppression process is executed, image information for which the processing by the MTF inverse transform section 104 has been executed is supplied to the arithmetic processing section 208.

The control section 90 accepts various instructions from the user and controls operation of the diffraction correction unit 100 and other various functioning sections. For example, while various procedures may be possible for the diffraction correction process in the second embodiment, since they are superior or inferior thereamong in terms of the processing speed and the correction accuracy. Therefore, it is recommendable to make it possible to allow suitable selection of which one of the methods is to be adopted in accordance with an instruction of the user.

The MTF shape storage section 102 stores MTF shape data such as the size, shape and distribution of the light transmitting portions 31. For example, wavelengths of external light for each of red (R), green (G) and blue (B) and MTF shape data of the light transmitting part 30 obtained by two-dimensional FFT are stored in the MTF shape storage section 102.

Image information acquired through the image pickup apparatus 20 or a processed image whose reflection noise has been suppressed by the reflection noise suppression processing unit 200 is sent to the MTF inverse transform section 104 which configures the diffraction correction unit 100. The MTF inverse transform section 104 reads out the wavelengths of external light for each of red (R), green (G) and blue (B) and the MTF shape data of the light transmitting part 30 obtained by the two-dimensional FFT from the MTF shape storage section 102 to carry out MTF inverse transform to restore an original image. Thereupon, in order to simplify the calculation to shorten the processing time, the process may be carried not for all signal components but paying attention to some signal component.

The control section 90 carries out various types of detection such as, for example, detection of the line of sight of the user or detection of a movement of a hand of the user from the restored image obtained by the diffraction correction unit 100, particularly the MTF inverse transform section 104 so as to be reflected on the display by the image display section 10.

FIG. 17 shows the image display system 2B of the second embodiment wherein an influence of a diffraction phenomenon is corrected from an aspect of signal processing. Referring to FIG. 17, the image display system 2B is different from the image display apparatus 1B described hereinabove with reference to FIG. 16 in that the control section 90, the reflection noise suppression processing unit 200 and the diffraction correction unit 100 are removed from the image display apparatus 1B to make an image display apparatus 1B_2 and the removed Control section 90, the reflection noise suppression processing unit 200 and diffraction correction unit 100 are incorporated in an peripheral apparatus 70B which is an example of an electronic apparatus.

In particular, the control section 90 may be provided in the image display apparatus 1B_2 or may be provided in the peripheral apparatus 70B such as a personal computer which is connected to the image display apparatus 1B_2. Also the reflection noise suppression processing unit 200 and the diffraction correction unit 100 may be provided in the image display apparatus 1B_2 or may be provided in the peripheral apparatus 70B such as a computer connected to the image display apparatus 1B_2.

Countermeasure Principle Against Diffraction Phenomenon

Figure 18A:
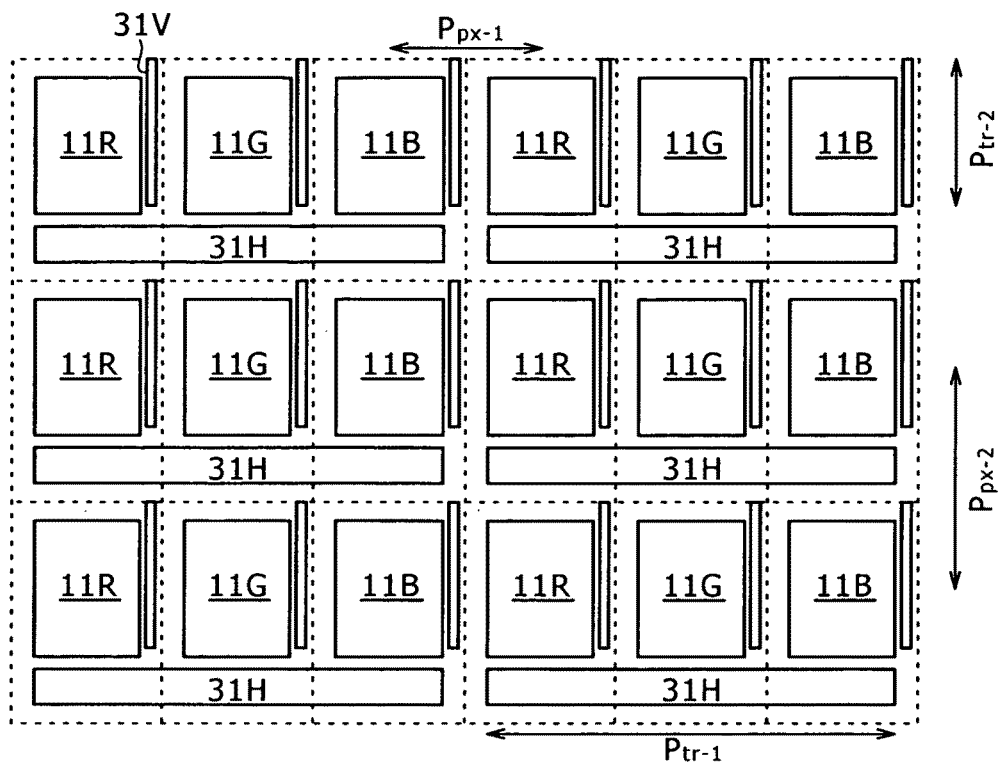
FIGS. 18A, 18B and 19 are views schematically showing different example of light transmitting portions.
Figure 18B:
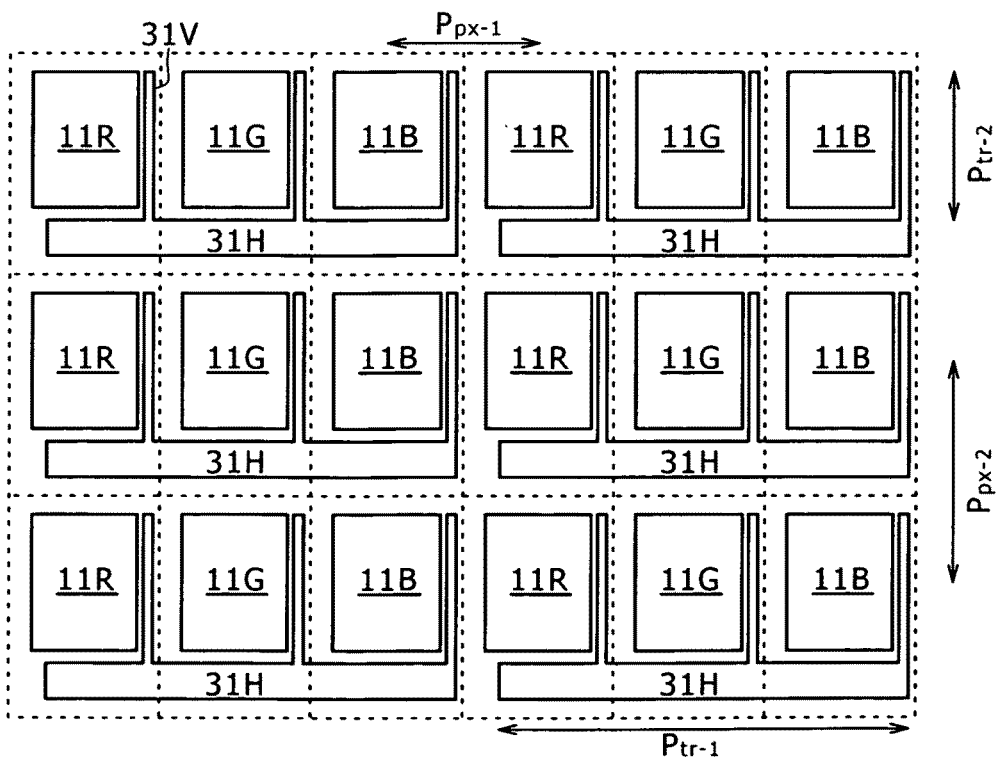
Figure 19:
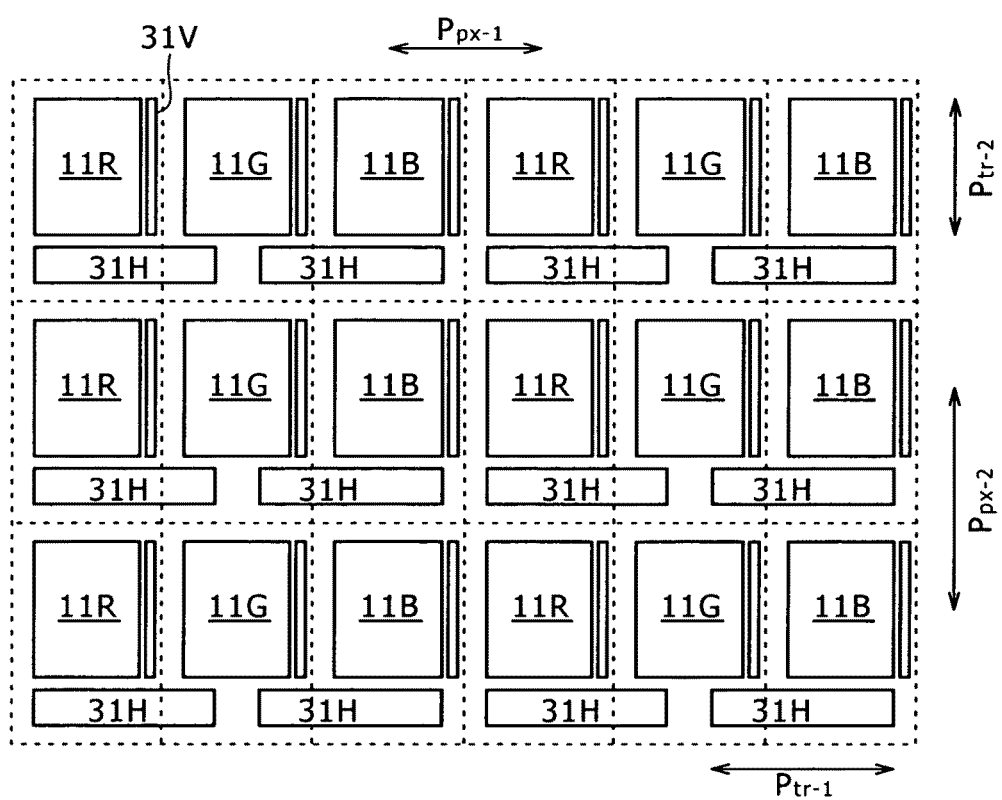

FIGS. 18A, 18B and 19 are schematic views illustrating a method of countermeasuring an influence of a diffraction phenomenon from an aspect of signal processing and schematically show an example of the shape of the light transmitting part 30 which is different from that shown in FIG. 2.

A diffraction distribution $P_{diff}$ can be calculated by an expression (1) given below in the case where the pattern shape, size and distribution of the light transmitting portions 31 and the wavelength of incident light, that is, external light, are determined. In the double integral, integration between $-\infty$ and $+\infty$ is carried out with regard to x and y.

$$P_{diff}(k_x,k_y)=\iint P_{at}(x,y)\cdot\exp[-j(k_x\cdot x+k_y\cdot y)]dxdy$$

$$k_x=(2\pi/\lambda)\sin(\theta_x)$$

$$k_y=(2\pi/\lambda)\sin(\theta_y) \quad (1)$$

where $P_{at}(x, y)$ is a two-dimensional pattern of the light transmitting portions 31 on the xy plane, $\lambda$ is the wavelength of the incidence light which is external light, and $\theta_x$ and $\theta_y$ are diffraction angles in the x direction and the y direction, respectively. Here, it is assumed that the value of the wavelength $\lambda$ of the incidence light or external light is 525 nm fixed in order to simplify the calculation.

The expression (1) can be calculated at a high speed using fast Fourier transform (FFT) because it represents two-dimensional Fourier transform of $P_{at}(x, y)$. While $P_{diff}(k_x, k_y)$ includes phase information, actually the image pickup apparatus detects the diffraction light intensity $H_{diff}(k_x, k_g)$. As seen from an expression (2), the diffraction light intensity $H_{diff}(k_x, k_y)$ is equal to the square of an absolute value of $P_{diff}(k_k, k_y)$.

$$H_{diff}(k_x,k_y)=|P_{diff}(k_x,k_y)|^2 \quad (2)$$

Here, on the assumption that modulation is applied to the spatial resolution of the image pickup apparatus 20 by diffraction light, an MTF (Modulation Transfer Function) is calculated from an expression (3). "FFT[ ]" signifies to execute fast Fourier transform, and "IFFT[ ]" signifies to execute inverse fast Fourier transform.

$$\eta(f_x,f_y)=|FFT[H_{diff}(k_x,k_y)]|^2 \quad (3)$$

where $f_x$ and $f_y$ represent spatial frequencies in the x direction and the y direction of each of the image pickup elements which configure the image pickup apparatus 20, respectively. Then, an image $I_{cam(x,y)}$ obtained by the image pickup apparatus 20 after transmission through the light transmitting part 30 and the original image $I_{real(x,y)}$ which is not transmitted through the light transmitting part 30 satisfies a relationship represented by an expression (4). The image $I_{cam(x,y)}$ is picked up image R data $R_{cam(x,y)}$ if it is of the red (R) component, picked up image G data $G_{cam(x,y)}$ if it is of the green (G) component, and picked up image B data $B_{cam(x,y)}$ if it is of the blue (B) component.

$$FFT[I_{cam(x,y)}]=FFT[I_{real(x,y)}]\times\eta(f_x,f_y) \quad (4)$$

In particular, in the spatial frequency region, the image $I_{cam(x,y)}$ is the product of the original image $I_{real(x,y)}$ and the MTF. Therefore, in order to obtain the original image $I_{real(x,y)}$ from the image $I_{cam(x,y)}$, processing based on an expression (5) may be carried out. In other words, an MTF reverse process carried out based on the shape, size and distribution of the light transmitting portions 31 and the wavelength of the incident light or external light (collectively referred to as "MTF shape data") may be carried out for the image information. The original image $I_{real(x,y)}$ is, for example, a red original image $R_{real(x,y)}$ with regard to the red (R) component, a green original image $G_{real(x,y)}$ with regard to the green (G) component, and a blue original image $B_{real(x,y)}$ with regard to the blue (B) component.

$$I_{real(x,y)}=IFFT[FFT[I_{cam(x,y)}]/\eta(f_x,f_y)] \quad (5)$$

Here, the MTF can be determined readily because, if the size, shape and distribution of the light transmitting portions 31 are determined, a result of Fourier transform of the two-dimensional pattern of the light transmitting portions 31 is scaled with the wavelength of the incidence light or external light. Therefore, an original image can be restored readily from the relationship represented by the expression (5).

For example, shapes of the light transmitting portions 31 are illustrated in FIGS. 18A, 18B and 19. Some or all of the light transmitting portions 31 are provided cyclically along a first direction, that is, along a horizontal direction, and a second direction, that is, a vertical direction, of the image display section 10.

In the example illustrated in FIG. 18A, a light transmitting portion 31H extending along the first direction, that is, in the horizontal direction, below pixels is provided over one pixel unit configured from three pixels 11R, 11G and 11B. Meanwhile, a light transmitting portion 31V extending along the second direction or vertical direction is provided for each of the pixels 11R, 11G and 11B and besides provided between pixels. Meanwhile, in the example illustrated in FIG. 18B, a light transmitting portion 31H and three light transmitting portions 31V are connected to each other. On the other hand, in the example illustrated in FIG. 19, while a light transmitting portion 31H is provided over one pixel unit configured from three pixels 11R, 11G and 11B, different from that in FIG. 18A, it is configured at two portions.

Where the length of a light transmitting portion 31 along the first direction is represented by $L_{tr-1}$ and the pitch of the pixels 11 along the first direction is represented by $P_{px-1}$, the line aperture ratio $L_{tr-1}/P_{px-1}$ in the first direction satisfies "$L_{tr-1}/P_{px-1} \geq 0.5$." Meanwhile, where the length of a light transmitting portion 31 along the second direction is represented by $L_{tr-2}$ and the pitch of the pixels 11 along the second direction is represented by $P_{px-2}$, the line aperture ratio $L_{tr-2}/P_{px-2}$ in the second direction satisfies "$L_{tr-2}/P_{px-2} \geq 0.5$." This can be explained from the definition of the MTF.

The MTF is obtained by fast Fourier transforming a squared value of a diffraction distribution obtained from the two-dimensional pattern $P_{at}(x, y)$ of the light transmitting portions 31 on the xy plane and then squaring a result of the fast Fourier transform.

$$\eta(f_x,f_y)=|FFT[|P_{diff}(k_x,k_y)|^2]|^2 \quad (6)$$

Then, since the Fourier transform of an autocorrelation function is equal to a power spectrum from the Wiener-Khinchin theorem, the MTF is equal to the square of an absolute value of an autocorrelation function of a diffraction distribution which occurs with the light transmitting portions 31. A condition that a point at which an autocorrelation function has no correlation in a spatial frequency region, that is, a point at which the correlation function is zero, does not exist is "$L_{tr-1}/P_{px-1} \geq 0.5$" and "$L_{tr-2}/P_{tr-2} \geq 2\ 0.5$." In the case where the MTF does not have a point at which it is zero, since the expression (5) does not have a singular point, reproduction of the original image is easy. Therefore, it is preferable to satisfy the request that the values of the line aperture ratio $L_{tr-1}/P_{px-1}$ in the first direction and the line aperture ratio $L_{tr-2}/P_{tr-2}$ in the second direction are equal to or higher than 0.5.

<Third Embodiment: Ready for Reflection Noise Suppression Process+Ready for Diffraction Correction+Ready for Wavelength Distribution Measurement>

Figure 20A:
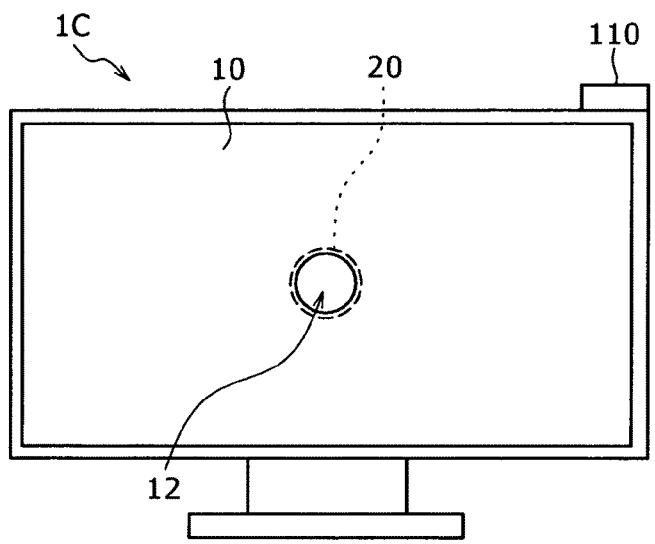
FIGS. 20A to 20D are schematic views of an image display apparatus and an image display system according to a third embodiment.
Figure 20B:
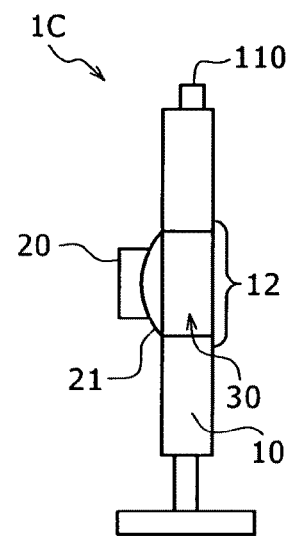
Figure 20C:
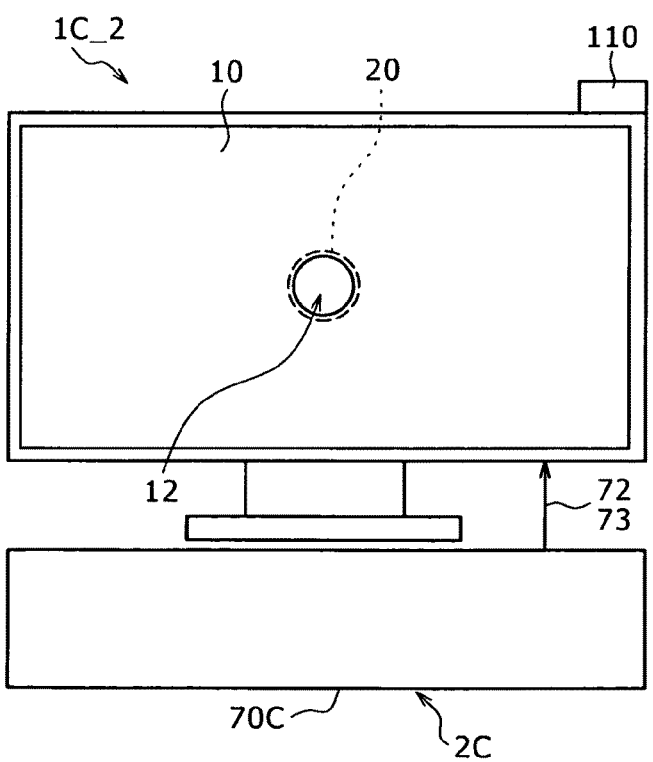
Figure 20D:
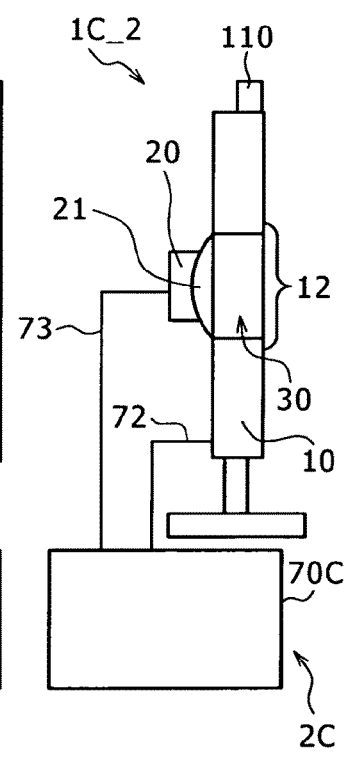
Figure 21:
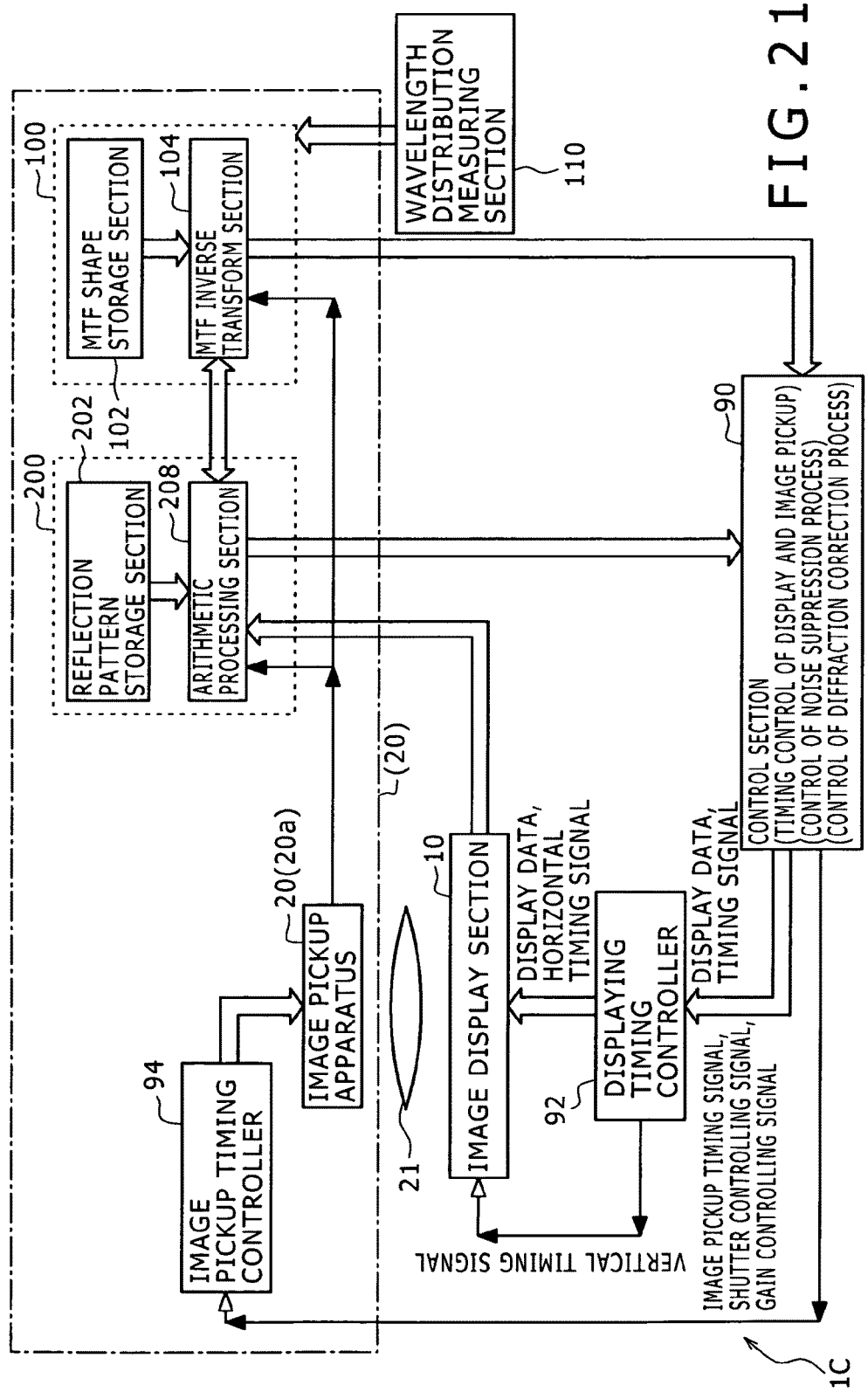
FIG. 21 is a block diagram of the image display apparatus according to the third embodiment.
Figure 22:
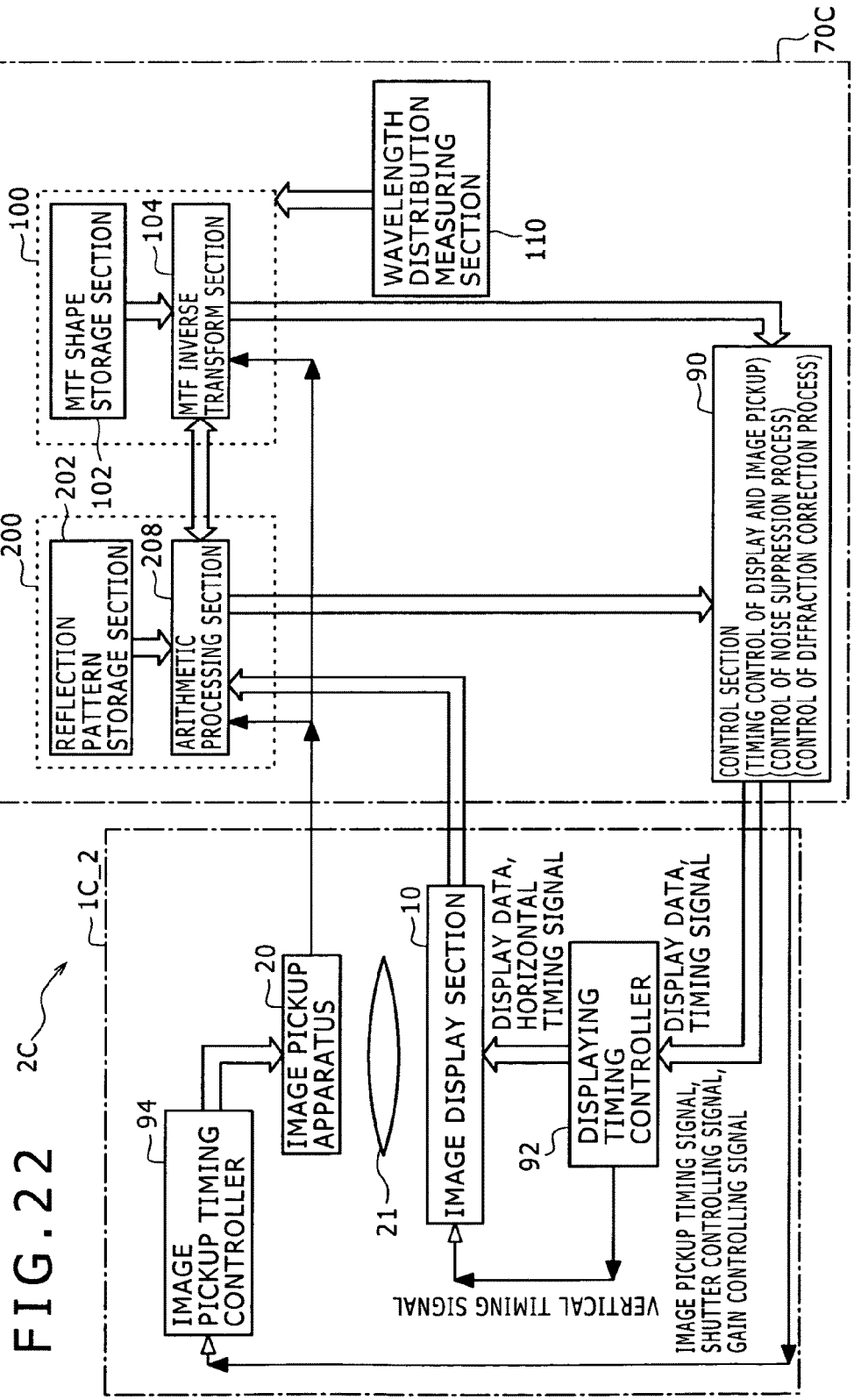
FIG. 22 is a block diagram of the image display system according to the third embodiment.

FIGS. 20A to 20D, 21 and 22 are views showing an image display apparatus and an image display system according to the third embodiment. Particularly, FIGS. 20A and 20B illustrate a concept of the image display apparatus, and more particularly, FIG. 20A is a schematic view showing the image display apparatus as viewed from the front and FIG. 20B is a schematic view showing the image display apparatus as viewed from a side. Meanwhile, FIGS. 20C and 20D illustrate a concept of the image display system, and more particularly, FIG. 20C is a schematic view showing the image display system as viewed from the front, and FIG. 20D is a schematic view showing the image display system as viewed from a side. FIG. 21 is a block diagram of an image display apparatus 10 according to the third embodiment which can carry out wavelength distribution measurement and FIG. 22 is a block diagram of an image display system 2C according to the third embodiment which can carry out wavelength distribution measurement.

Referring first to FIGS. 20A and 20B, the image display apparatus 10 of the third embodiment includes a wavelength distribution measuring section 110 configured to measure the wavelength distribution of external light in addition to the image display apparatus 1B of the second embodiment. The wavelength distribution measuring section 110 may be removably mounted on the image display apparatus 10. In the present example, the wavelength distribution measuring section 110 is arranged at an upper portion of a panel of the image display section 10. However, this is an example, and the wavelength distribution measuring section 110 may be arranged at any place only if it can measure the wavelength distribution of external light.

Referring now to FIGS. 20C and 20D, the image display system 2C of the third embodiment includes the wavelength distribution measuring section 110 configured to measure the wavelength distribution of external light in addition to the image display system 2B of the second embodiment. Information acquired by the wavelength distribution measuring section 110 is supplied to the diffraction correction unit 100. The wavelength distribution measuring section 110 may be arranged at any place in the proximity of the image display apparatus 1C_2 only if it can measure the wavelength distribution of external light.

The wavelength distribution measuring section 110 is configured, for example, from a set of a photo-sensor to which a red filter is attached, another photo-sensor to which a green filter is attached and a further photo-sensor to which a blue sensor is attached.

Referring now to FIG. 21, in the image display apparatus 1C shown, a control section 90 controls a measuring operation of the wavelength distribution measuring section 110. Information acquired by the wavelength distribution measuring section 110 is supplied to the diffraction correction unit 100. Referring now to FIG. 22, in the image display system 2C shown, the control section 90 incorporated in a peripheral apparatus 70C controls a measuring operation of the wavelength distribution measuring section 110.

As described hereinabove in connection with the second embodiment, the expression (1) for determining the diffraction distribution $P_{dif}(k_x, k_y)$ on the xy plane of the light transmitting part 30 includes the wavelength λ of incidence light, that is, external light. Accordingly, by measuring the wavelength distribution of the external light, the MTF of the individual wavelengths can be applied in response to an external environment and correction or compensation for diffraction can be carried out with a higher degree of accuracy. Consequently, a picked up image of higher quality can be obtained.

By the provision of the wavelength distribution measuring section 110, a wavelength distribution or light spectrum of external light can be obtained. Then, by multiplying the obtained wavelength distribution of the external light and the spectrum of the image pickup apparatus 20, a wavelength distribution for each of the primary colors of red, green and blue of the picked up image can be obtained. Then, by weighting the image for which the MTF inverse transform process has been carried out for each wavelength with the wavelength distribution of the picked up image, correction or compensation for the diffraction can be carried out with a higher degree of accuracy.

In the third embodiment, since such a configuration as described above is adopted, not only correction or compensation for diffraction can be carried out with a higher degree of accuracy, but also it is possible to achieve enhancement of the accuracy of the image information acquired through the image pickup apparatus 20, for example, enhancement of the color information.

<Alternative of a Monitor Apparatus of an Electronic Equipment>

Figure 23A:
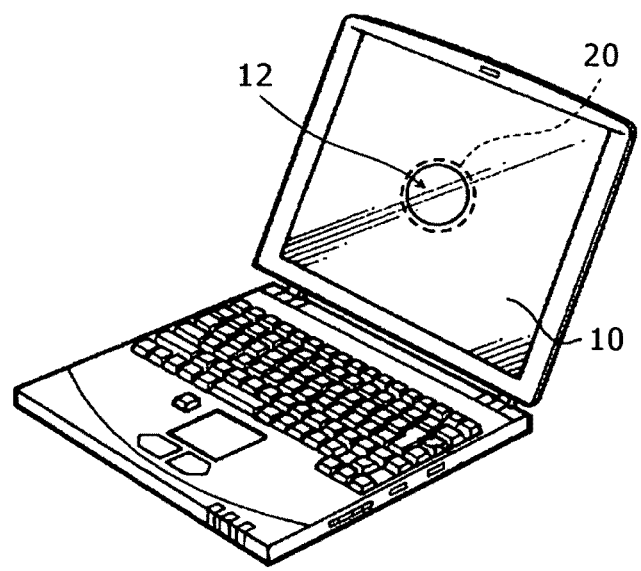
FIGS. 23A and 23B are schematic views showing examples of an electronic apparatus to which the image display apparatus of any of the first to third embodiments is applied.
Figure 23B:
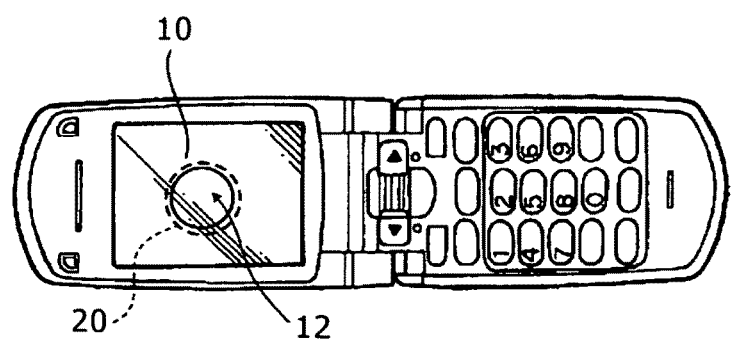
Figure 24A:
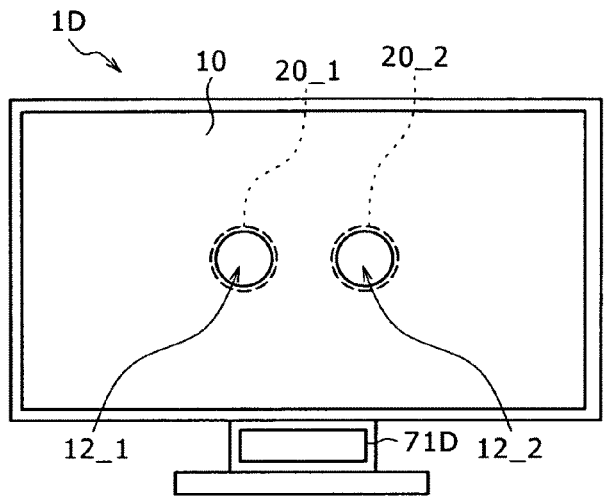
FIGS. 24A to 24C are views showing a second modification to the image display apparatus.
Figure 24B:
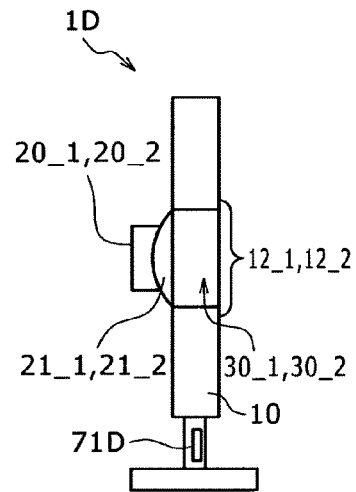
Figure 24C:
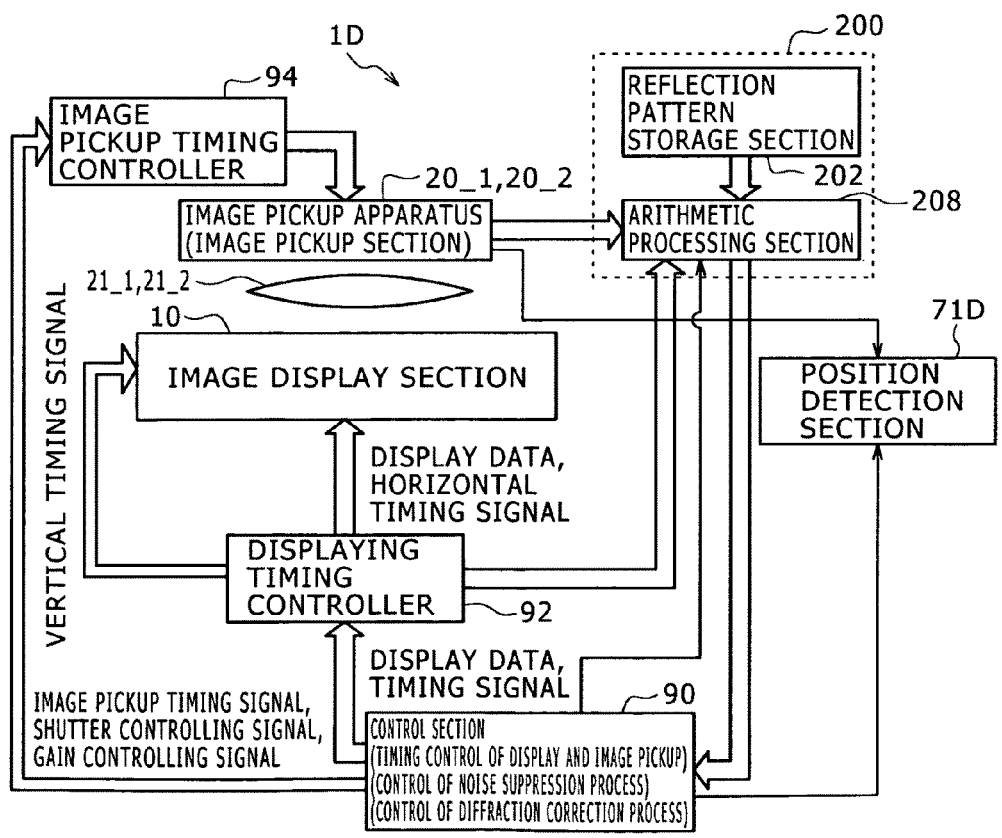

FIGS. 23A and 23B are views showing different examples of an electronic apparatus to which the image display apparatus 1 is applied. Any of the image display apparatus 1A, 1B and 1C can be used, for example, not only as an alternative of a monitor apparatus which configures a personal computer but also as an alternative of a monitor apparatus of various electronic apparatus. For example, the image display apparatus 1A, 1B or 1C can be used as an alternative of a monitor apparatus incorporated in such a notebook type personal computer as seen in FIG. 23A. Further, the image display apparatus 1A, 1B or 1C can be used as an alternative of a monitor apparatus incorporated in such a portable telephone set as shown in FIG. 23B or, though not shown, a PDA (Personal Digital Assistant) or a game machine, or of a television receiver. In any case, the light transmitting region 12 in which the light transmitting portions 31 not shown are formed is provided on the image display section 10, and the image pickup apparatus 20 is provided on the rear face on the opposite side to the display face side.

While preferred embodiments of the present disclosure have been described above with reference to the accompanying drawings, the technical scope of the present disclosure is not limited to the embodiments. Various alterations or modifications could have been made to the embodiments described hereinabove without departing from the spirit and scope of the disclosure as defined in claims, and also such alterations and modifications naturally fall within the technical scope of the present disclosure.

The image display apparatus 1 or the image display system 2 described hereinabove in connection with the embodiments can be modified further. In the following, several modifications are described.

First Modification: Position Detection

Though not shown, according to a first modification, the image display apparatus 1 or the image display system 2 includes a position detection section configured to determine position information of an image pickup object based on image information acquired through the image pickup apparatus 20. The position detection section may be provided in the image display apparatus or may be provided in a peripheral apparatus.

If an image is picked up through the light transmitting part 30, then since noise by a reflection phenomenon appears with the picked up image, a drop of the detection accuracy of the position information of an image pickup object is worried about. However, since the working effects by the configuration including the reflection noise suppression processing unit 200 described hereinabove can be enjoyed, an influence of noise by a reflection phenomenon upon image pickup through the light transmitting part 30 can be suppressed. Consequently, the position information of the image pickup object can be acquired with a high degree of accuracy. The image pickup object may be, for example, a hand, a finger or an eyeball of an observer or user who observes the image display section 10 or a bar-like article held by a hand of the user or the like.

If position information of an image pickup object such as a hand, a finger, an eyeball or a bar-like article such as, for example, a pen or a pencil is determined continuously in a time series by the position detection section, then a movement of the image pickup object can be determined. Therefore, various processes in response to the movement of the image pickup object such as, for example, an upward or leftward movement or a leftward or rightward movement of an image, a process of closing a screen image or a process of opening another screen image on a monitor apparatus of a personal computer, can be carried out. A relationship between a movement of an image pickup object and various processes may be registered in the position detection section in advance.

As occasion demands, it is possible to determine the shape of an image pickup object such as, for example, a shape represented by a shape of the body or a hand, a shape represented by a combination of fingers, a gesture or the like from position information of the image pickup object based on a known algorithm or software by means of the position detection section to carry out various processes corresponding to the shape of the image pickup object. Further, if the direction in which the image pickup object is directed is determined by the position detection section, then various processes corresponding to the direction in which the image pickup object is directed can be carried out.

Second Modification: Three-Dimensional Image Display+Position Detection

A second modification is shown in FIGS. 24A to 25B. In the second modification shown in FIGS. 24A to 25B, a plurality of, typically two, image pickup apparatus 20 are arranged on the rear face side of the image display section 10 such that the position from the image display section 10 to a user can be determined based on image information from the image pickup apparatus 20 by a position detection section 71D. The position detection section 71D may be provided in the image display apparatus 1D or may be provided in a peripheral apparatus 70D. Although the modification shown is a modification to the first embodiment, it can be applied also to the other embodiments.

Since noise by a reflection phenomenon can appear with picked up images upon image pickup through the light transmitting parts 30_1 and 30_2, a drop of the detection accuracy of the position information of the observer is worried about. However, since the working effects by the configuration including the reflection noise suppression processing unit 200 described hereinabove can be enjoyed, an influence of noise by a reflection phenomenon upon image pickup through the light transmitting part 30 can be suppressed. Consequently, the position information of the observer can be acquired with a high degree of accuracy.

The position information of the observer may be used as position data of both eyes of the observer or may be used as distance data from the image display section 10 to the observer. Further, the position information of the observer can be determined based on both eyes of the observer of the image data picked up through the image pickup apparatus 20_1 and 20_2. The position information of the observer may be displayed on the image display section 10. This makes it possible to instruct the observer clearly of an optimum three-dimensional image observation position or guide the observer to the optimum three-dimensional image observation position so that the observer can observe a three-dimensional image readily. Or, images to be displayed on the image display section 10 may be optimized based on the position information of the observer.

Third Modification: TV Conference System

Though not shown, in a third modification, the mechanism of any of the embodiments described hereinabove is applied to a television conference system or television phone apparatus. In the third modification, an information signaling section configured to signal image information acquired through the image pickup apparatus 20 and a display control section configured to control the image display section 10 to display an image based on image information inputted from the outside are provided further. Image information acquired through the image pickup apparatus 20 is signaled to the outside by the information signaling section. Meanwhile, an image based on image information inputted from the outside is displayed on the image display section 10 under the control of the display control section. The information signaling section and the display control section may be provided in the image display apparatus or may be provided in a peripheral apparatus.

With the third modification, since the image pickup apparatus 20 is arranged on the rear face side of the image display section 10, an image of the face of the user who is positioned in front of the image display section 10 can be picked up. Further, since the face of a user on the opposing party side displayed on the image display section 10 is directed toward the user of the image display section 10, such an uncomfortable feeling that the lines of sight of the users do not coincide with each other as in a TV conference system in the past is not provided to the users. Since also the working effects by the configuration which includes the reflection noise suppression processing unit 200 as described hereinabove can be enjoyed, an image of the face or the like of the user in a state in which an influence of reflection noise is suppressed is displayed on the image display section 10 on the opposing party side.

Fourth Modification: Digital Mirror

Though not shown, in a fourth modification, the image display apparatus 1 of the embodiments described hereinabove is caused to function as a digital mirror.

In the fourth modification, an image information storage section configured to store image information acquired through the image pickup apparatus 20 and a display control section configured to control the image display section 10 to display an image based on the information acquired through the image pickup apparatus 20 or acquired already and the image information stored in the image information storage section are provided further. The image information storage section and the display control section may be provided in the image display apparatus or may be provided in a peripheral apparatus.

With the fourth modification, results of comparison of the user in the past and at present can be displayed in separate windows from each other on the image display section 10. Since also the working effects by the configuration which includes the reflection noise suppression processing unit 200 described hereinabove can be enjoyed, an image of the face or the like of the user in a state in which an influence of reflection noise is suppressed is displayed on the image display section 10.

The present disclosure contains subject matter related to that disclosed in Japanese Priority Patent Application JP 2010-130273 filed in the Japan Patent Office on Jun. 7, 2010, the entire content of which is hereby incorporated by reference.

What is claimed is:

1. An image display apparatus comprising:
   a first substrate between an image pickup section and a second substrate, a picked up image at said second substrate being transmissible through said first substrate to said image pickup section;
   display elements between said first substrate and said second substrate, said display elements being configured to allow image light from the picked up image to pass therethrough and to emit display light to output a display image through said second substrate,
   wherein said image pickup section is configured to detect said picked up image during a time period in which the display elements output the display image.

2. The image display apparatus according to claim 1, wherein each of the display elements includes a light emitting element.

3. The image display apparatus according to claim 1, wherein said picked up image is an image of an object.

4. The image display apparatus according to claim 1, wherein said picked up image is transmissible through said image display section.

5. The image display apparatus according to claim 1, wherein said first substrate is between said image pickup section and said display elements.

6. The image display apparatus according to claim 1, further comprising:
   a timing control section configured to synchronize display timing of the image display section with image pickup timing of the image pickup section.

7. The image display apparatus according to claim 1, further comprising:
   a condensing section configured to condense said picked up image onto said image pickup section, said condensing section being between said image pickup section and said first substrate.

8. The image display apparatus according to claim 1, further comprising:
   a noise suppression processing unit configured to perform noise suppression on said picked up image to suppress a reflection component of the picked up image, a portion the display image reflected from said second substrate being said reflection component.

9. The image display apparatus according to claim 8, wherein said noise suppression extracts a particular region of the picked up image from a background region of the picked up image, said reflection component in only said particular region being suppressed during said noise suppression.

10. The image display apparatus according to claim 8, wherein said noise suppression uses luminance information from said display elements.

11. The image display apparatus according to claim 1, further comprising:
   a light transmitting portion between said second substrate and said display elements, said display image and said picked up image being transmissible through openings in said light transmitting portion.

12. The image display apparatus according to claim 11, further comprising:
   a diffraction correction unit configured to perform a diffraction correction process, said diffraction correction process suppressing an influence of a diffraction effect on said picked up image.

13. The image display apparatus according to claim 12, wherein said openings cause said diffraction effect.

14. The image display apparatus according to claim 12, further comprising:
   a wavelength distribution measuring section configured to convert a wavelength distribution of external light into wavelength distribution information, said diffraction correction process using said wavelength distribution information.

15. The image display apparatus according to claim 14, wherein said external light is transmissible through said second substrate to said first substrate, said external light being other than an object image.

16. The image display apparatus according to claim 15, wherein said object image is transmissible through said second substrate to said first substrate, a portion of the picked up image being said object image.

17. An electronic apparatus comprising:
   the image display apparatus according to claim 1.

18. The image display apparatus according to claim 1, wherein the image pickup section is provided adjacent to a rear surface of the first substrate.

19. An image acquisition method comprising:
   a step of allowing image light from a picked up image to pass through display elements and of emitting display light to output a display image from the display elements through a second substrate, said display elements between a first substrate and said second substrate;
   a step of detecting the picked up image, said picked up image at said second substrate being transmitted through said first substrate to an image pickup section,
   wherein said image pickup section detects said picked up image during a time period in which the display elements output the display image.

20. A non-transitory computer-readable medium storing instructions that when executed with an image display apparatus, causes the image display apparatus to execute the image acquisition method according to claim 19.

* * * * *